(12) United States Patent
Nie et al.

(10) Patent No.: US 9,059,199 B2
(45) Date of Patent: Jun. 16, 2015

(54) METHOD AND SYSTEM FOR A GALLIUM NITRIDE VERTICAL TRANSISTOR

(71) Applicant: AVOGY, Inc., San Jose, CA (US)

(72) Inventors: Hui Nie, Cupertino, CA (US); Andrew P. Edwards, San Jose, CA (US); Isik Kizilyalli, San Francisco, CA (US); David P. Bour, Cupertino, CA (US); Thomas R. Prunty, Sunnyvale, CA (US); Quentin Diduck, Santa Clara, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/735,912

(22) Filed: Jan. 7, 2013

(65) Prior Publication Data

US 2014/0191242 A1    Jul. 10, 2014

(51) Int. Cl.
*H01L 29/66* (2006.01)
*H01L 29/808* (2006.01)

(52) U.S. Cl.
CPC ...... *H01L 29/66431* (2013.01); *H01L 29/8083* (2013.01)

(58) Field of Classification Search
CPC . H01L 51/56; H01L 51/0072; H01L 51/5012; H01L 51/5253; H01L 29/66; C08F 212/14
USPC .............. 257/76, 40, 263, E21.447, E29.313, 257/E29.089
See application file for complete search history.

(56) References Cited

U.S. PATENT DOCUMENTS

| 2006/0220072 | A1* | 10/2006 | Harris et al. | 257/256 |
|---|---|---|---|---|
| 2007/0029573 | A1 | 2/2007 | Cheng et al. | |
| 2008/0163814 | A1 | 7/2008 | Kim et al. | |
| 2013/0146886 | A1* | 6/2013 | Disney et al. | 257/76 |
| 2013/0341677 | A1* | 12/2013 | Nie et al. | 257/192 |

FOREIGN PATENT DOCUMENTS

WO    2011/163318 A2    12/2011

OTHER PUBLICATIONS

International Search Report and Written Opinion from PCT/US2013/076009 mailed on Apr. 18, 2014, 14 pages.

* cited by examiner

*Primary Examiner* — Chuong A Luu
*Assistant Examiner* — Rodolfo Fortich
(74) *Attorney, Agent, or Firm* — Kilpatrick Townsend & Stockton LLP

(57) ABSTRACT

A vertical JFET includes a GaN substrate comprising a drain of the JFET and a plurality of patterned epitaxial layers coupled to the GaN substrate. A distal epitaxial layer comprises a first part of a source channel and adjacent patterned epitaxial layers are separated by a gap having a predetermined distance. The vertical JFET also includes a plurality of regrown epitaxial layers coupled to the distal epitaxial layer and disposed in at least a portion of the gap. A proximal regrown epitaxial layer comprises a second part of the source channel. The vertical JFET further includes a source contact passing through portions of a distal regrown epitaxial layer and in electrical contact with the source channel, a gate contact in electrical contact with a distal regrown epitaxial layer, and a drain contact in electrical contact with the GaN substrate.

7 Claims, 21 Drawing Sheets

METHOD AND SYSTEM FOR A GALLIUM NITRIDE VERTICAL TRANSISTOR

CROSS-REFERENCES TO RELATED APPLICATIONS

The following two regular U.S. patent applications (including this one) are being filed concurrently, and the entire disclosure of the other application is incorporated by reference into this application for all purposes:
application Ser No. 13/735,897, filed Jan. 7, 2013, entitled "GALLIUM NITRIDE VERTICAL JFET WITH HEXAGONAL CELL STRUCTURE"; and
application Ser. No. 13/735,912, filed Jan. 7, 2013, entitled "METHOD AND SYSTEM FOR A GALLIUM NITRIDE VERTICAL TRANSISTOR".

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to methods and systems for manufacturing vertical junction field-effect transistors (JFETs) using gallium-nitride (GaN) based epitaxial layers. Merely by way of example, an embodiment of the present invention utilizes a GaN epitaxial structure with a hexagonal cell structure oriented at a predetermined crystallographic orientation. Another embodiment of the present invention utilizes a two-part source channel structure as a component of the JFET device. The methods and techniques can be applied to a variety of compound semiconductor systems including vertical JFETs, electrical contact structures, diode structures, and the like.

According to an embodiment of the present invention, an array of GaN-based vertical JFETs is provided. The array includes a GaN substrate comprising a drain of one or more of the JFETs and one or more epitaxial layers coupled to the GaN substrate. The array also includes a plurality of hexagonal cells coupled to the one or more epitaxial layers and extending in a direction normal to the GaN substrate. Sidewalls of the plurality of hexagonal cells are substantially aligned with respect to crystal planes of the GaN substrate. The array further includes a plurality of channel regions, each having a portion adjacent a sidewall of the plurality of hexagonal cells, a plurality of gate regions of one or more of the JFETs, each electrically coupled to one or more of the plurality of channel regions, and a plurality of source regions of one or more of the JFETs electrically coupled to one or more of the plurality of channel regions.

According to another embodiment of the present invention, a vertical JFET is provided. The vertical JFET includes a III-nitride substrate, a III-nitride epitaxial layer coupled to the III-nitride substrate, and a III-nitride epitaxial structure coupled to the first III-nitride epitaxial layer. The III-nitride epitaxial structure includes a set of hexagonal regrowth pedestals, each having sidewalls and a top surface including a lateral channel layer and a set of source channel regions, each surrounding one of the set of hexagonal regrowth pedestals. Each source channel region comprises a first portion adjacent the sidewalls and a second portion disposed in the lateral channel layer. The III-nitride epitaxial structure also includes a set of gate regions, each surrounding one of the source regions. The vertical JFET further includes a drain region electrically coupled to the III-nitride substrate.

According to a specific embodiment of the present invention, a method of fabricating a vertical JFET is provided. The method includes providing a III-nitride epitaxial structure including a III-nitride substrate and a plurality of epitaxial layers coupled to the III-nitride substrate. The method also includes removing a portion of the plurality of epitaxial layers to form a set of recesses extending a predetermined distance into the plurality of epitaxial layers. The set of recesses are disposed between remaining portions of the plurality of epitaxial layers. The method further includes regrowing a plurality of regrown epitaxial layers coupled to at least a portion of one of the plurality of epitaxial layers and the remaining portions of the plurality of epitaxial layers. One of the plurality of regrown epitaxial layers is electrically coupled to one of the plurality of epitaxial layers. Additionally, the method includes removing a portion of the plurality of regrown epitaxial layers to expose a portion of the one of the plurality of epitaxial layers, forming a source contact electrically coupled to the one of the plurality of epitaxial layers, forming a gate contact electrically coupled to another of the plurality of epitaxial layers, and forming a drain contact electrically coupled to the III-nitride substrate.

According to another specific embodiment of the present invention, a vertical JFET is provided. The vertical JFET includes a GaN substrate comprising a drain of the JFET and a plurality of patterned epitaxial layers coupled to the GaN substrate. A distal epitaxial layer with respect to the GaN substrate comprises a first part of a source channel, and portions of adjacent patterned epitaxial layers are separated by a gap having a predetermined distance. The vertical JFET also includes a plurality of regrown epitaxial layers coupled to the distal epitaxial layer and disposed in at least a portion of the gap. A proximal regrown epitaxial layer with respect to the GaN substrate comprises a second part of the source channel. The vertical JFET further includes a source contact passing through portions of a distal regrown epitaxial layer with respect to the GaN substrate and in electrical contact with the source channel, a gate contact in electrical contact with a distal regrown epitaxial layer with respect to the GaN substrate, and a drain contact in electrical contact with the GaN substrate.

Numerous benefits are achieved by way of the present invention over conventional techniques. For example, embodiments of the present invention provide devices with improved epitaxial layer quality in comparison with conventional devices. Additionally, embodiments of the present invention provide device designers with separate control over elements of the source channel, enabling device optimization not possible with conventional designs. These and other embodiments of the invention, along with many of its advantages and features, are described in more detail in conjunction with the text below and attached figures.

DETAILED DESCRIPTION OF SPECIFIC EMBODIMENTS

Figure 1:
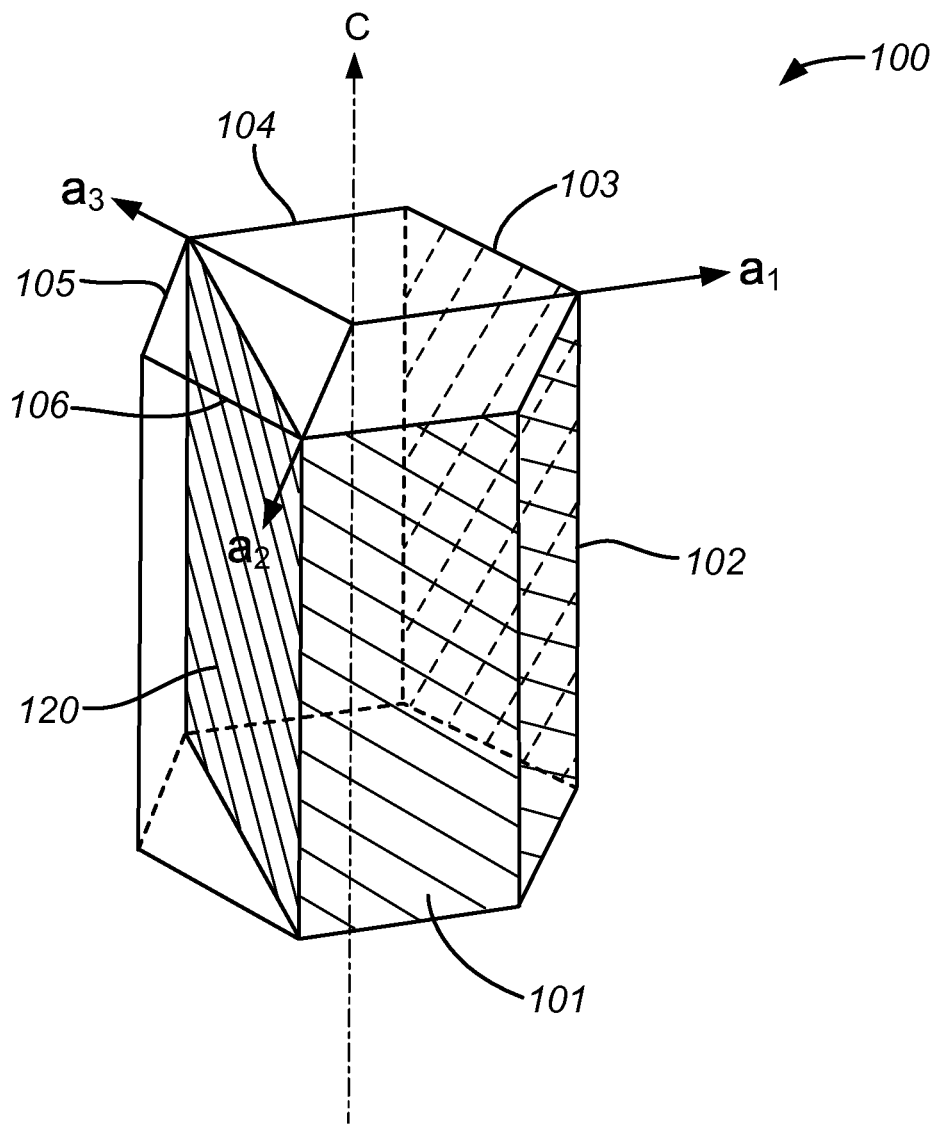
FIG. 1 is a simplified schematic diagram of the crystalline structure of hexagonal crystals.

Embodiments of the present invention relate to electronic devices. More specifically, the present invention relates to methods and systems for manufacturing vertical junction field-effect transistors (JFETs) using gallium-nitride (GaN) based epitaxial layers. Merely by way of example, an embodiment of the present invention utilizes a GaN epitaxial structure with a hexagonal cell structure oriented at a predetermined crystallographic orientation. Another embodiment of the present invention utilizes a two-part source channel structure as a component of the JFET device. The methods and techniques can be applied to a variety of compound semiconductor systems including vertical JFETs, electrical contact structures, diode structures, and the like.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, $\mu$, is higher for a given background doping level, N. This provides low resistivity, $\rho$, because resistivity is inversely proportional to electron mobility, as provided by equation (1):

$$\rho = \frac{1}{q\mu N}, \qquad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \qquad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures contemplated is a vertical JFET. Depending on doping levels, physical dimensions, conductivity type (e.g., n-type or p-type materials), and other factors, vertical JFETs can be designed to have normally-off or normally-on functionality. A normally-off vertical JFET is particularly useful due to its ability to prevent current flow if no voltage is applied to the gate, which can serve as, among other things, a safety feature for vertical JFETs used in power applications.

A normally-off vertical JFET can be created in various ways. For example, an n-type current path from source to drain can be gated on either side by p+ gates. With sufficiently low background doping, and high positive charge due to high hole concentration in the p+ gates, the channel can be depleted of carriers, or pinched off at zero bias. When a positive voltage is applied to the gate(s), the channel can be re-opened to turn the device on. Thus, in embodiments of the present invention, the device is referred to as a vertical junction field effect transistor since the current flows in a generally vertical direction between the source and drain through the gated region. As described more fully herein, embodiments of the present invention can also provide a JFET design in which the current flow through the gated region is along both vertical and horizontal paths.

In addition to the ability to support a new range of high-voltage, low-resistance JFET applications, the GaN vertical JFETs described herein can differ from traditional vertical JFETs in other ways. Other semiconductors can be utilized to manufacture vertical JFETs with different properties, such as SiC, altering the mode of manufacture. Furthermore, the use of GaN epitaxial layers can allow for non-uniform dopant concentrations as a function of thickness within the various layers of the vertical JFET, which can optimize the performance of the device.

FIG. 1 is a simplified schematic diagram illustrating the crystalline structure of hexagonal crystals. As will be evident to one of skill in the art, GaN-based wurtzite crystalline structures are hexagonal in character. As illustrated in FIG. 1, a hexagonal crystal 100, including a GaN crystal, has six faces oriented in a vertical direction in the figure, or m-planes, 101-106. The m-planes share a 60° interior angle between adjacent planes. An a-plane 120 is also illustrated in FIG. 1, which is perpendicular to the $a_1$ axis. Additional a-planes perpendicular to the $a_2$ and $a_3$ axes are not illustrated for purposes of clarity. The c-planes include the plane defined by the three axes $a_1$, $a_2$, and $a_3$.

According to embodiments of the present invention, epitaxial growth of GaN-based epitaxial layers and structures is performed using a GaN-based epitaxial structure on which a hexagonal mesa structure has been defined by etching, promoting epitaxial growth on predetermined crystal faces of the GaN-based epitaxial structure. Although some embodiments are discussed in terms of epitaxial growth on a GaN substrate, embodiments of the present invention are not limited to GaN substrates. Other III-V materials, in particular, III-nitride materials, are included within the scope of the present invention and can be substituted not only for the illustrative GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are also included within the scope of the present invention. Additionally, embodiments can use materials having an opposite conductivity type to those illustrated in order to provide devices with different functionality. For example, embodiments provided herein focus on the formation of a JFET with n-type drain and channel regions. However, a p-type JFET can be formed by using materials with opposite conductivity (e.g., substituting p-type materials for n-type materials, and vice versa) in a similar manner as will be evident to one of skill in the art.

As described herein, the inventors have determined that epitaxial growth of GaN-based epitaxial layers on exposed m-planes provides epitaxial layers with higher quality characteristics than epitaxial growth of GaN-based epitaxial layers on exposed a-planes or other high index crystalline planes. Accordingly, embodiments of the present invention pattern a GaN-based epitaxial structure to provide a plurality of hexagonal structures oriented to provide exposed en-planes suitable for epitaxial regrowth.

Figure 2A:
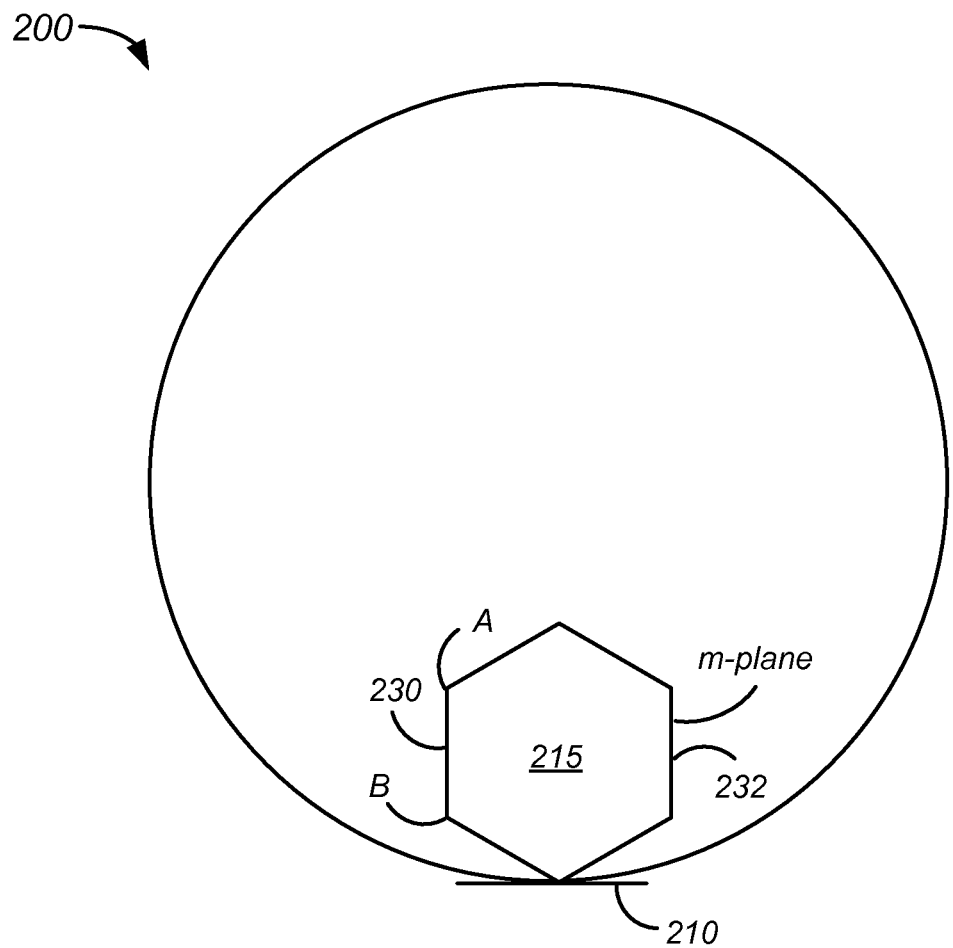
FIG. 2A is a simplified plan view of a hexagonal projection suitable for epitaxial regrowth according to an embodiment of the present invention.

FIG. 2A is a simplified plan view of a hexagonal projection suitable for epitaxial regrowth according to an embodiment of the present invention. Referring to FIG. 2A, the GaN substrate 200 is illustrated with a-plane flat 210. An array of hexagonal projections 215 extend in a direction substantially normal to the GaN substrate 200. The hexagonal projections have a hexagonal shape when viewed from the top and have sidewalls extending to a predetermined distance from the substrate surface. The gallium face of the epitaxy is the face lying in the plane of the figure (i.e., the top surface of the hexagonal projections in this plan view). As described more fully below, the hexagonal projections can include multiple epitaxial layers of differing conductivity types, providing material for use in fabricating portions of gate as well as source regions of the vertical JFET.

The hexagonal projections 215 can be formed using a variety of fabrication techniques including inductively-coupled plasma (ICP) etching and/or other GaN etching processes. The orientation of the hexagonal projections 215 is defined during the formation process such that the faces of the hexagonal projections that are extending substantially normal to the substrate surface (i.e., the sidewalls) are substantially aligned with the m-planes of the GaN crystal. Thus, in this illustration, the faces that will support regrowth are the gallium face (i.e., the top surface) and the six faces (referred to as sidewalls or regrowth faces) that are aligned with the m-planes.

Figure 2B:
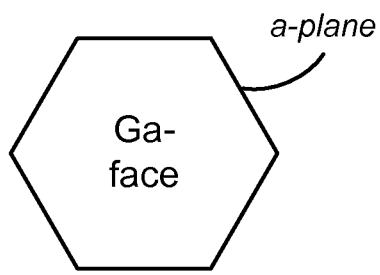
FIG. 2B is a simplified plan view of a hexagonal projection with exposed a-planes.

For purposes of comparison, FIG. 2B is a simplified plan view of a hexagonal projection with exposed a-planes. The hexagonal projection illustrated in FIG. 2B is oriented with respect to the substrate (not shown) such that the regrowth faces are aligned with the a-planes. The inventors have determined that regrowth on the a-planes (or other high index crystalline planes) as would be associated with the hexagonal projection illustrated in FIG. 2B produces inferior results in comparison with hexagonal projections in which the regrowth faces are aligned with m-planes as illustrated in FIG. 2A.

In order to form the structure illustrated in FIG. 2A, the formation process for the hexagonal structures (e.g., an etch process) can utilize a mask for the hexagons that is aligned with respect to the a-plane flat (or other suitable reference) such that the sides 230 and 232 of the hexagon are aligned perpendicular to the a-plane flat. In other words, the hexagon is oriented with vertices A and B aligned along a normal to the a-plane flat. Accordingly, the m-planes of the hexagonal projection resulting from the formation process will be the regrowth faces and the c-plane will be the top face of the hexagonal projection. In contrast with some conventional processes, the sides of the hexagonal projections, which provide regrowth surfaces, are aligned with respect to the crystal planes of the GaN substrate, particularly, the m-planes.

Figure 3:
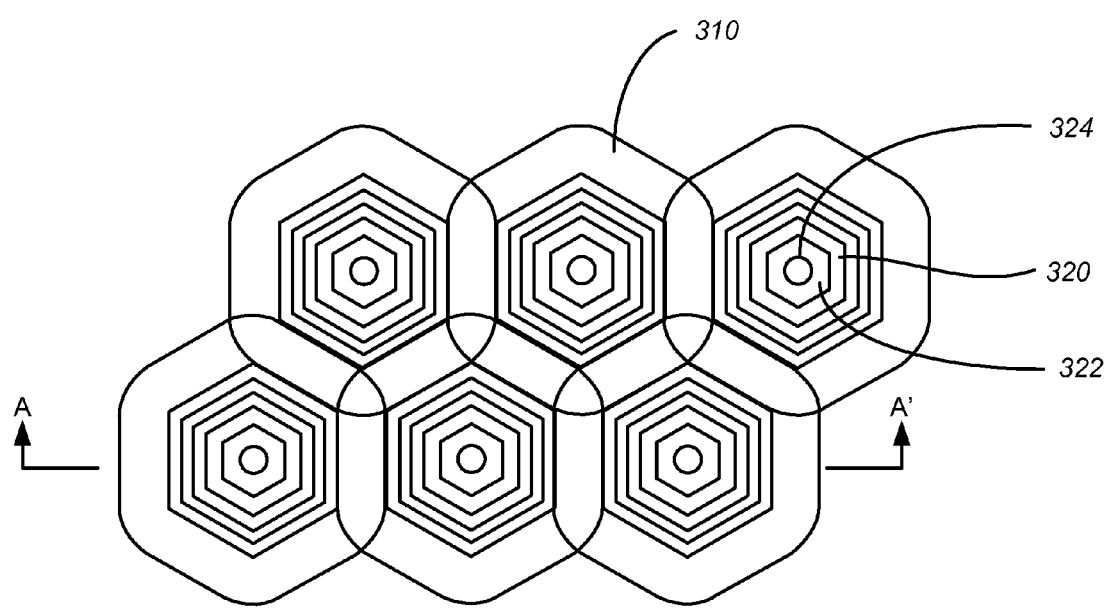
FIG. 3 is a plan view of a hexagonal cell structure for vertical JFETs according to an embodiment of the present invention.

FIG. 3 is a plan view of a hexagonal cell structure for vertical JFETs according to an embodiment of the present invention. As illustrated in FIG. 3, the transistors are laid out in a hexagonal pattern to provide for high current density operation as a result of the tiled layout. A hexagonal pattern is used in the definition and etching of trenches 310 to produce regrowth pedestals for the regrowth process. In an embodiment, the regrowth pedestals are fabricated from one layer (e.g., a p-type gate layer) of a multi-layer epitaxial structure also including a drift layer (e.g., n-type GaN) formed on a III-nitride (e.g., GaN) substrate using suitable buffer layers. Each of the hexagonal regrowth pedestals includes six sidewalls and a top surface.

As described more fully below, embodiments of the present invention utilize a two-part channel to form elements of the channel region of the vertical transistor, including a first part that has a layer of material that is regrown on the sidewalls of the regrowth pedestals. Thus, in an embodiment, each channel region comprises a first portion adjacent the sidewalls of the regrowth pedestals. A second part of the two-part channel includes a second portion forming on the top surface of the regrowth pedestals. The first part and the second part can be referred to as a vertical channel and a lateral channel, respectively, since current flow through the two-part channel is in a vertical direction adjacent the sidewalls and a lateral or horizontal direction through the top surface of the regrowth pedestals.

Disposed in the lateral channel regions are gate regions. In an embodiment, the gate regions include regrowth material disposed in a plane passing through the regrowth pedestals (i.e., a horizontal or lateral plane parallel to the plane of the substrate). This regrown material is grown in trenches 310 that have a conductivity type the same as one or more layers of the regrowth pedestals. One of ordinary skill in the art would recognize many variations, modifications, and alternatives.

In order to provide for electrical contact to the source of the vertical transistors, a source region 320 is defined (illustrated as a hexagonal structure), with source contact region 322 and source plug region 324 formed inside the source region as smaller hexagonal structures, respectively. The source plug structure is used to electrically connect the source to the bottom gate layer if desired. In addition to hexagonal structures, one or more of these elements may be implemented using other shapes including rectangular, circular, or oval shapes.

Although not illustrated in FIG. 3, gate contacts are provided at another portion of the device, providing for electrical connectivity to the gate regions of the vertical JFETs. One of ordinary skill in the art would recognize many variations, modifications, and alternatives.

Figure 4:
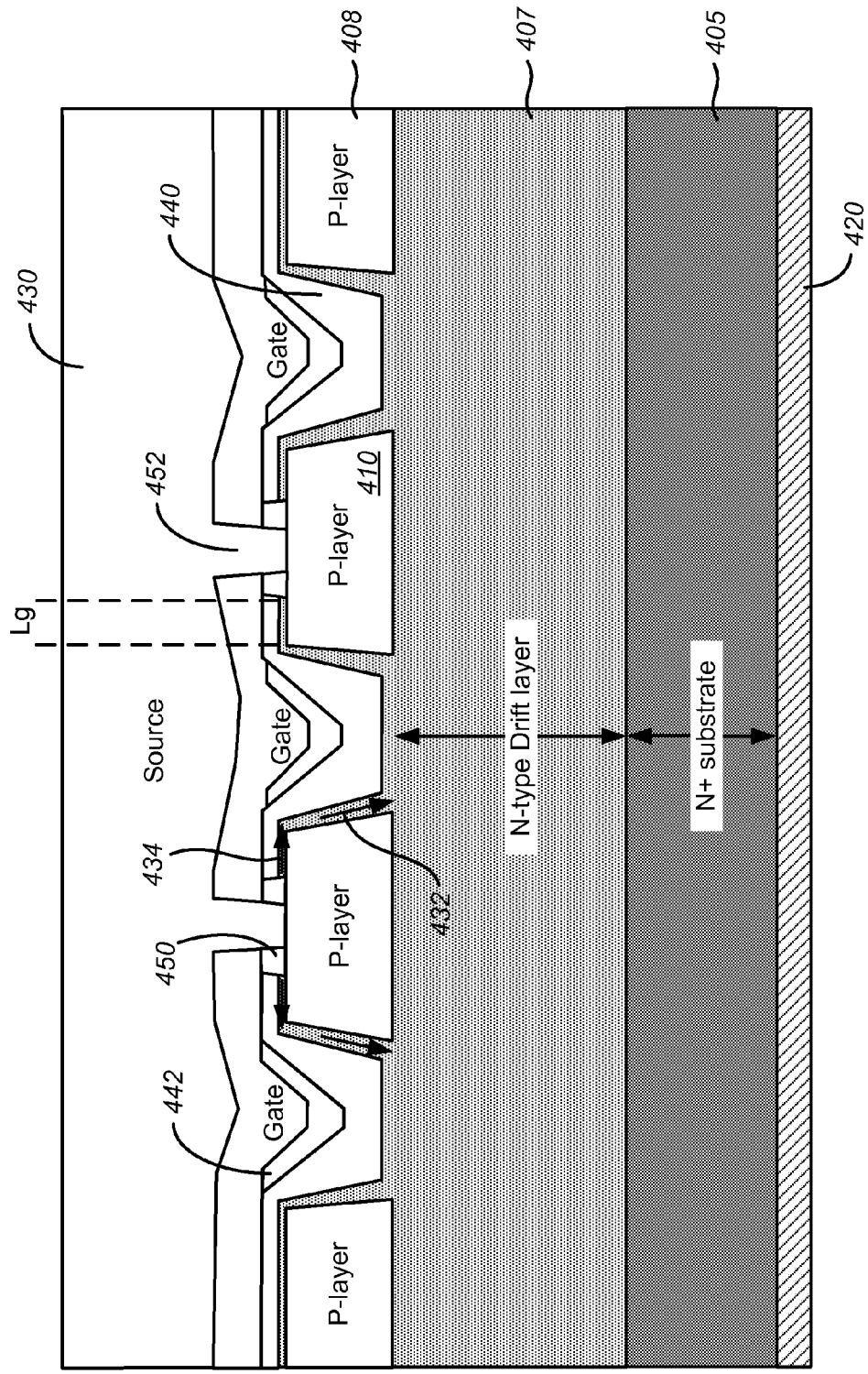
FIG. 4 is a simplified cross-sectional view illustrating a vertical JFET according to an embodiment of the present invention.

FIG. 4 is a simplified cross-sectional view illustrating a vertical JFET according to an embodiment of the present invention. As illustrated in FIG. 4, the vertical JFET includes a plurality of transistors arrayed to provide for current flow through the transistor structure in a vertical configuration when placed in the on-state. As described in relation to FIG. 3, the plurality of transistors are arrayed in a hexagonal array in some embodiments to provide benefits including high packing density and resulting high current density. Additionally, as described more fully throughout the specification, the vertical JFETs provided by embodiments of the present invention utilize two-part channel regions that include components that are oriented parallel to the substrate as well as components that are oriented substantially perpendicular to the substrate.

The fabrication process for the vertical JFET transistor is described in relation to FIGS. 5A-5L below. In summary, one or more epitaxial layers (e.g., the illustrated drift layer 407, which can be an n-type III-nitride (e.g., GaN) layer or combination of layers and an epitaxial layer 408 that will be patterned to fabricate regrowth pedestals, which is illustrated as a p-type III-nitride layer) are formed on a III-nitride substrate 405 and patterned to form regrowth pedestals 410. Source channel material is regrown on the sidewalls and top surfaces of the regrowth pedestals to provide for a current path having a substantially vertical orientation from the drain region 420 to the source region 430. Subsequently, gate material is regrown in the trenches between the regrowth pedestals, enabling the source channel regions having a first conductivity type (e.g., n-type) to be disposed between material of a second conductivity type (p-type). In the illustrated embodiment, the source channel includes a first portion 432 (also referred to as a part or region) that is substantially vertical in orientation and a second portion 434 that is substantially horizontal in orientation. Because the first portion 432 and the second portion 434 can be separately optimized, embodiments of the present invention provide design flexibility that is not available using conventional designs.

Gate material 440 is then regrown in the remaining regions of the trenches between regrowth pedestals and gate contacts 442 are formed to provide electrical connectivity for gate connections. Source contact regions 450 and source contact 452 are formed, typically passing through an insulating material (e.g., an interlayer dielectric) that is deposited and patterned as described herein.

The operation of a vertical JFET utilizing a vertical current path is described in additional detail in U.S. patent application Ser. No. 13/198,655, filed on Aug. 24, 2011, the disclosure of which is hereby incorporated by reference in its entirety for all purposes. In comparison with the vertical JFET described therein, embodiments of the present invention utilize both a vertical source channel region as well as a lateral source channel region, for which the default mode of operation can be normally-off. In the normally-off mode of operation, the depletion regions, with no external bias applied to the gate contacts, overlap at one or more portions of either the vertical source channel region or the lateral source channel region, or both, thereby preventing current flow through the source channel regions from the drain to the source. Application of a voltage between the gate contacts and source contact results in separation of the depletion regions, allowing current to flow in a vertical direction from the drain 420 through the drift region 407, the vertical source channel region 432, the lateral source channel region 434 to the source 430. Thus, in this embodiment, application of a voltage to the gate contacts turns the vertical JFET on by decreasing the size of the depletion regions and thereby providing a current path through the two-part channel.

In some implementations, during operation of a device with a two-part channel, under reverse bias, the vertical source channel region 432 will pinch off first, thereby providing protection for the lateral source channel region 434. Since the lateral source channel is an as-grown epitaxial layer in some embodiments, this part of the channel can be short in comparison with conventional source channels, narrow in cross-section, and highly doped (both of which tend to reduce the reverse bias voltage at which the lateral source channel region pinches off). In some implementations, the device geometry results in the depletion region penetrating different depths into the lateral source channel region 434 and the vertical source channel region 432, enabling a higher level of control over the conductivity of the channel. Accordingly, under reverse bias, leakage currents can be reduced in comparison with conventional designs.

Referring back to FIG. 3, the hexagonal structures inside trench 310 can include hexagonal projections associated with regrowth pedestals 410. Thus, the cross-section illustrated in FIG. 4 can be associated with cross-section A-A' in FIG. 3.

Figure 5A:
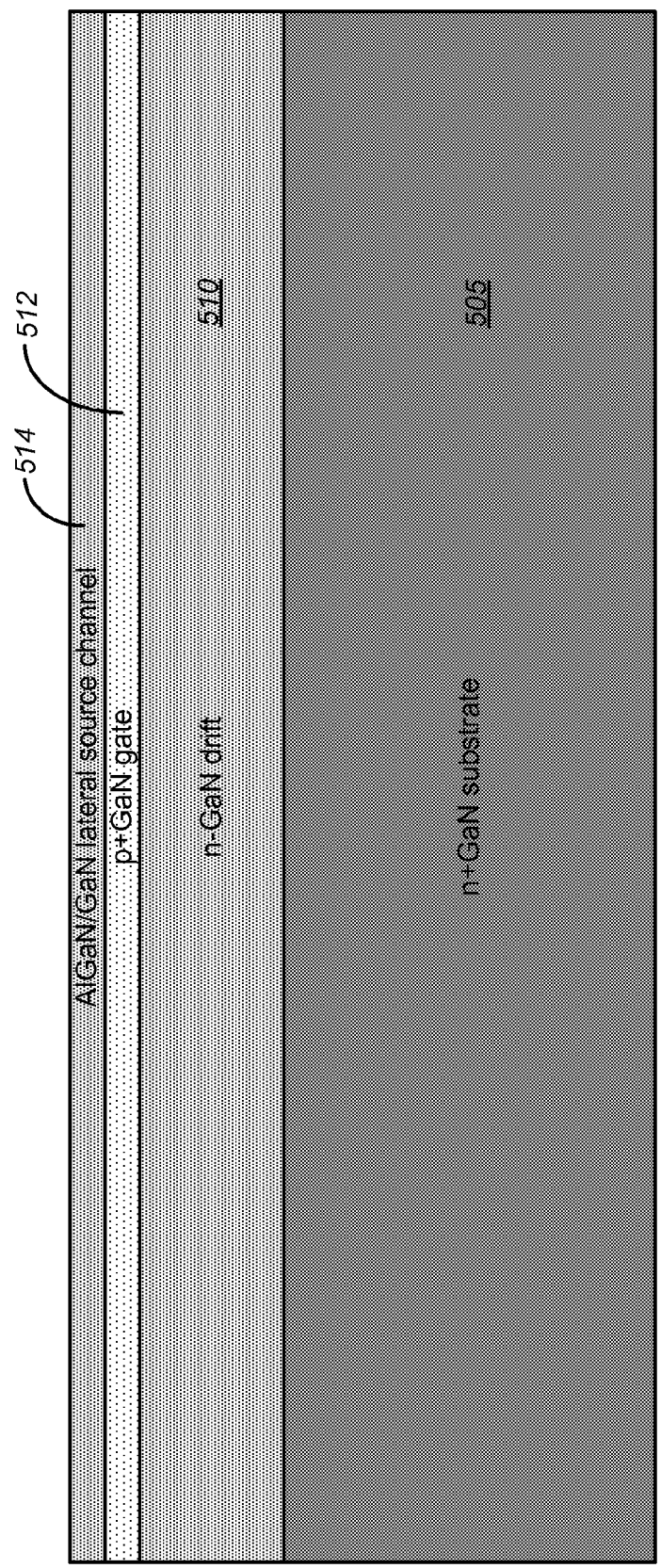
FIGS. 5A-5L are simplified process flow diagrams illustrating fabrication of a vertical JFET according to an embodiment of the present invention.

FIGS. 5A-5L are simplified process flow diagrams illustrating fabrication of a vertical JFET according to an embodiment of the present invention. The fabrication process illustrated in FIGS. 5A-5L utilizes a process flow in which an n-type drift layer is grown over an n-type substrate. Referring to FIG. 5A, a substrate 505 is provided. In the illustrated embodiment, the substrate 505, which will be associated with the drain of the vertical JFET, is an n-type III-nitride (e.g., GaN) substrate, but the present invention is not limited to this particular material. GaN substrate 505 can have an n+ conductivity type, with dopant concentrations ranging from $1 \times 10^{17}$ cm$^{-3}$ to $1 \times 10^{19}$ cm$^{-3}$. In other embodiments, substrates with p-type doping are utilized. Additionally, although a GaN substrate is illustrated in FIG. 5A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention. Additionally, embodiments can use materials having an opposite conductivity type to provide devices with different functionality.

Although some embodiments are discussed in terms of GaN substrates and GaN epitaxial layers, the present invention is not limited to these particular binary III-V materials and is applicable to a broader class of III-V materials, in particular III-nitride materials. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Coupled to the substrate 505, a first epitaxial layer 510 is grown, which will provide a drift region of n-type GaN material for the vertical JFET. The first epitaxial layer 510 acting as the drift layer will have properties such as thickness and doping concentration that are determined by the transistor design and the properties of the first epitaxial layer 510 can also vary, depending on desired functionality. Serving as the drift region for the vertical JFET, the first epitaxial layer 510 can be a relatively low-doped material. For example, the first epitaxial layer 510 can have an n− conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the epitaxial layer.

The thickness of the first epitaxial layer 510 can also vary substantially, depending on the desired functionality. As discussed above, homoepitaxial growth can enable the first epitaxial layer 510 to be grown far thicker than layers formed using conventional methods. In general, in some embodiments, thicknesses can vary between 0.5 µm and 100 µm, for example, thicknesses greater than 5 µm. Resulting breakdown voltages for the vertical JFET can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, zinc, or the like. Additional description related to thicknesses, dopant concentrations, and breakdown voltages of the drift layer are provided in U.S. patent application Ser. No. 13/198,661, filed on Aug. 4, 2011, the disclosure of which is hereby incorporated by reference in its entirety.

A second epitaxial layer 512 is formed to provide material from which the regrowth pedestals (i.e., hexagonal projections) that were discussed in relation to FIGS. 2A and 3 can be fabricated. The properties of the second epitaxial layer 512 will vary depending on the particular application, but can include a p-type III-nitride (e.g., GaN) material that will provide a portion of the regrowth surfaces for source channel material as well as gate material in some embodiments. In an embodiment, the thickness of the second epitaxial layer ranges from about 0.1 µm to about 0.5 µm, for example, 0.2 µm. The reduced thickness of the second epitaxial layer, in comparison with conventional designs, enables a more planar structure to be produced, improving device yield and performance. Additionally, as discussed herein, the use of a two-part source channel structure enables separate optimization of the elements of the source channel, including one part fabricated using as-grown epitaxial material (i.e., the third epitaxial layer 514 discussed below) and another part fabricated using regrown epitaxial material (i.e., the first regrown layer 522 discussed below).

A third epitaxial layer 514 is formed to provide material that will be used as the lateral source channel regions of the vertical JFET. The third epitaxial layer 514 can use n-type material having a dopant concentration between $1 \times 10^{15}$ cm$^{-3}$ and $1 \times 10^{18}$ cm$^{-3}$ depending on the particular device design. As described more fully below, the thickness of the third epitaxial layer 514 will define one dimension of the lateral source channel regions and the doping will be a factor in defining the on-resistance of the JFET. These parameters are separately controllable from the other portion (i.e., the vertical source channel regions) of the JFET, providing design flexibility not available with conventional designs. In an embodiment, the doping concentration in the range of about $2 \times 10^{16}$ cm$^{-3}$ to about $2 \times 10^{18}$ cm$^{-3}$ and the thickness ranges from about 25 nm to about 0.5 µm. In a particular embodiment, the thickness is 0.1 µm and the doping concentration is $5 \times 10^{17}$ cm$^{-3}$.

In some embodiments, the third epitaxial layer 514 includes GaN material, AlGaN material, combinations thereof, or the like. An appropriately designed AlGaN and GaN hetero-interface forms a two dimensional electrical gas (2DEG) due to large induced polarization fields. In this case, high lateral conductivity can be achieved without using heavy doping in the lateral channel. Although an AlGaN layer is illustrated and is characterized by a larger bandgap than GaN, this is not required by the present invention and other embodiments can utilize other III-nitride materials such as InAlN, AlN, or combinations of materials as the third, or additional, epitaxial layers. One of ordinary skill in the art would recognize many variations, modifications, and alternatives.

Figure 5B:
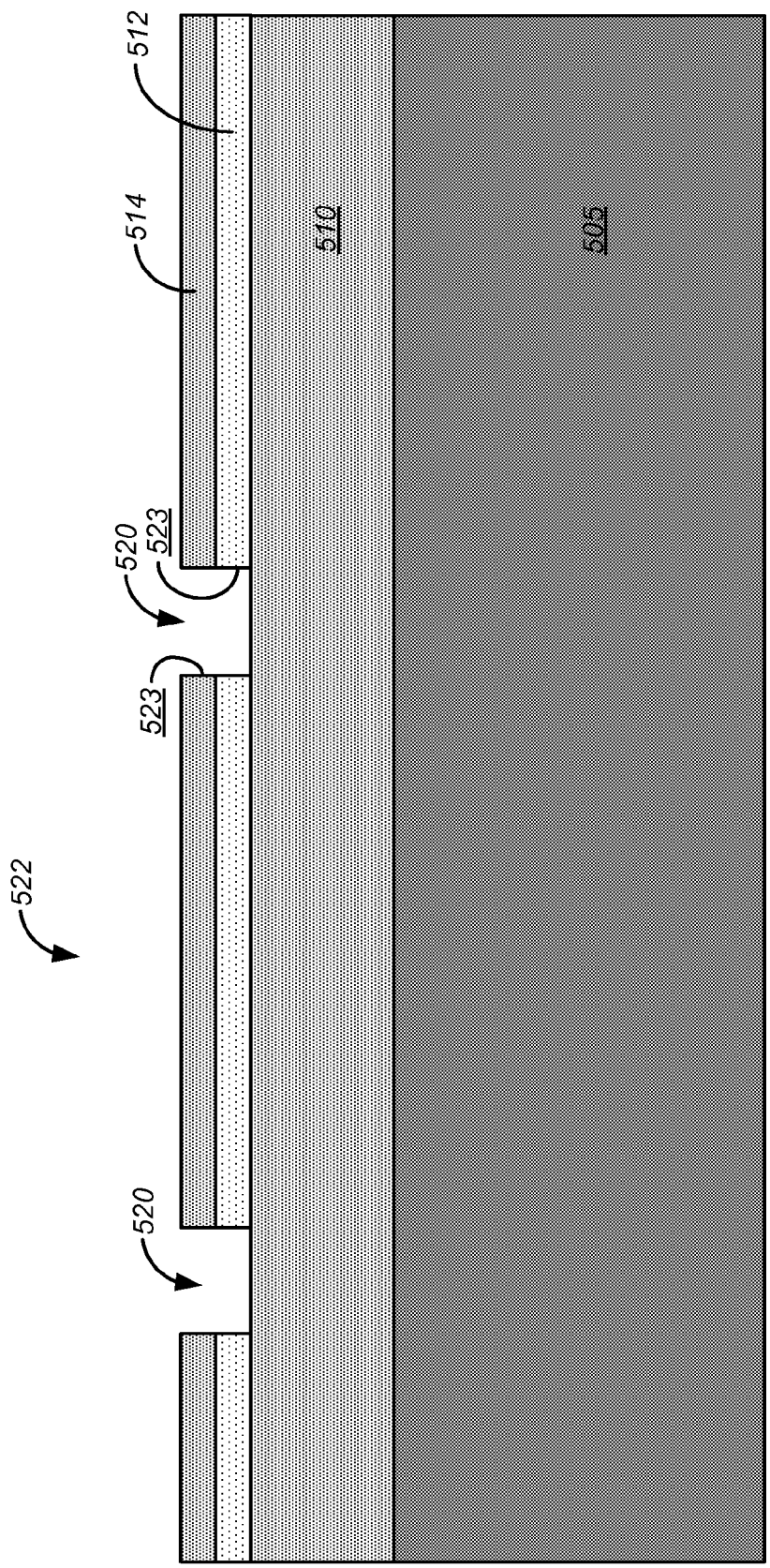

Referring to FIG. 5B, a mask (not shown) is formed and portions of the second epitaxial layer 512 and the third epitaxial layer 514 are removed, for example, using an etching process. After the removal process, trenches 520 are formed between adjacent regrowth pedestals 522. In a plan view, the trenches 520 are hexagonal in shape in some embodiments, corresponding to the hexagonal trenches 310 illustrated in FIG. 3. In some embodiments, the etch process includes one or more portions that are selective to terminate the etch process on reaching the first epitaxial layer 510. In other embodiments, a portion of the first epitaxial layer 510 may be removed during the etch process. One of ordinary skill in the art would recognize many variations, modifications, and alternatives. After the masking and removal process, regrowth surfaces are provided on the sidewalls 523 of the regrowth pedestals 522, including the exposed portions of the second epitaxial layer 512 and the exposed portions of the third epitaxial layer 514 as well as the top surface of the third epitaxial layer 514.

Figure 5C:
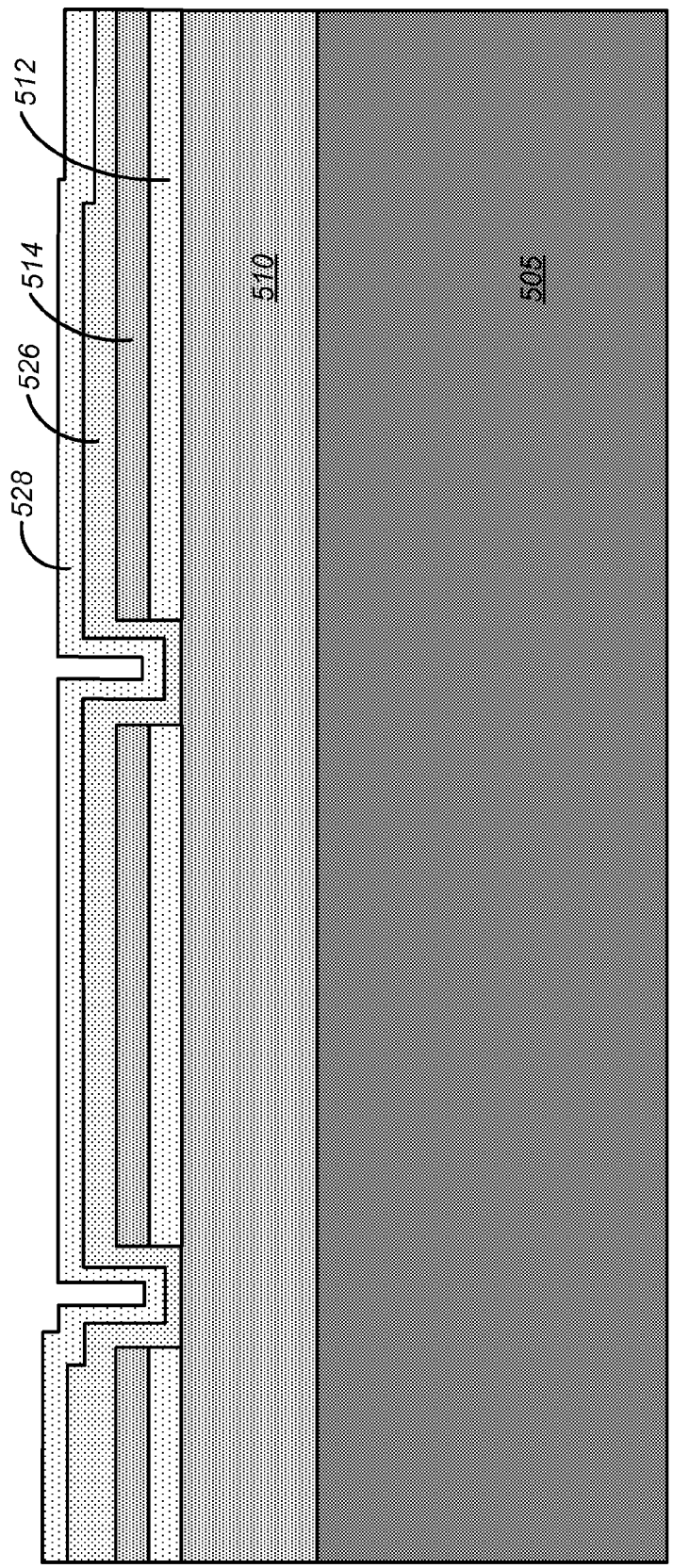

FIG. 5C illustrates regrowth of multiple epitaxial layers both in the trenches 520 (shown in FIG. 5B) previously formed as well as over the regrowth pedestals. The first regrown layer 526 provides material suitable for use in fabricating the vertical source channel regions (see 432 in FIG. 4) of the vertical JFET and the second regrown layer 528 provides material suitable for use in fabricating portions of the gate regions (see 440 in FIG. 4) of the vertical JFET. As will be described more fully below, both the vertical source channel regions and the lateral source channel regions are placed in either an on-state or an off-state through application of bias between the gate material associated with the second epitaxial layer 512, now present in the regrowth pedestals, and the gate material present in the second regrowth layer 528.

The parameters for the first regrowth layer 526 and the second regrowth layer 528 will depend on the particular implementation. As an example, the first regrowth layer 526 can have a thickness ranging from about 25 nm to about 0.5 µm, for example, between 50 nm and 200 nm. The doping concentration of the first regrowth layer 526 can range of about $5 \times 10^{15}$ cm$^{-3}$ to about $2 \times 10^{18}$ cm$^{-3}$ depending on the particular implementation.

The second regrowth layer 528 can have a thickness ranging from about 50 nm to about 1.0 µm. Although the second regrowth layer 528 is illustrated as not completely filling the trenches, in some embodiments, the second regrowth layer can fill the trenches and form a planarized structure, although this is not required by the present invention. The doping concentration of the second regrowth layer 528 can range of about $5 \times 10^{17}$ cm$^{-3}$ to about $5 \times 10^{19}$ cm$^{-3}$ depending on the particular implementation.

Figure 5D:
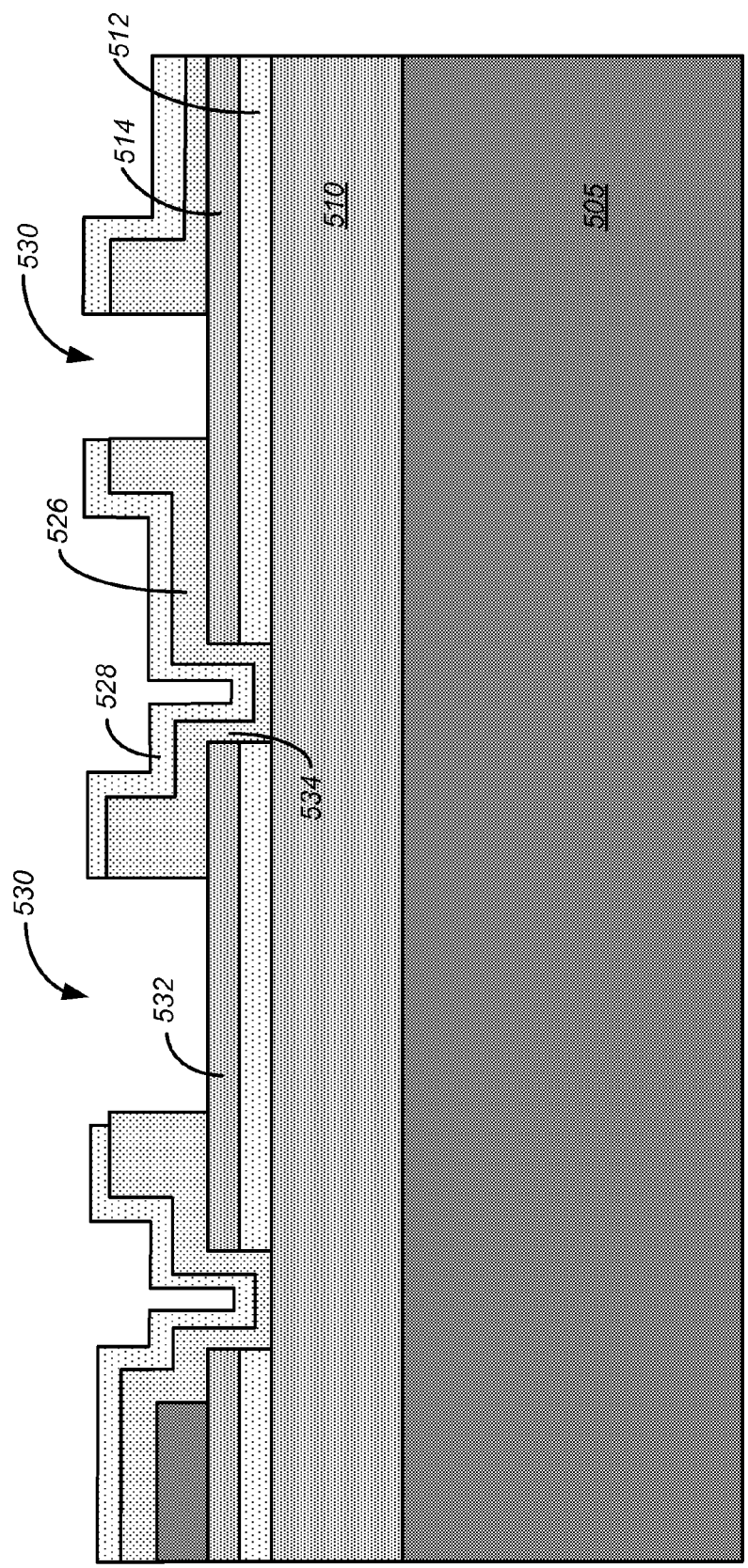

FIG. 5D illustrates the source definition process in which a mask (not shown) is formed and portions of the second regrowth layer 528 and the first regrowth layer 526 are removed, for example, by etching to form source regions 530. Referring to FIG. 3, source region 320 is formed as a hexagonal pattern in some embodiments. The source definition process exposes the third epitaxial layer 514 in order to provide electrical connection between source structures and the lateral source channel regions 532 and the vertical source channel regions 534. In some implementations, the source definition process utilizes a selective etch that preferentially terminates at the third epitaxial layer 514 (e.g., AlGaN layer).

Figure 5E:
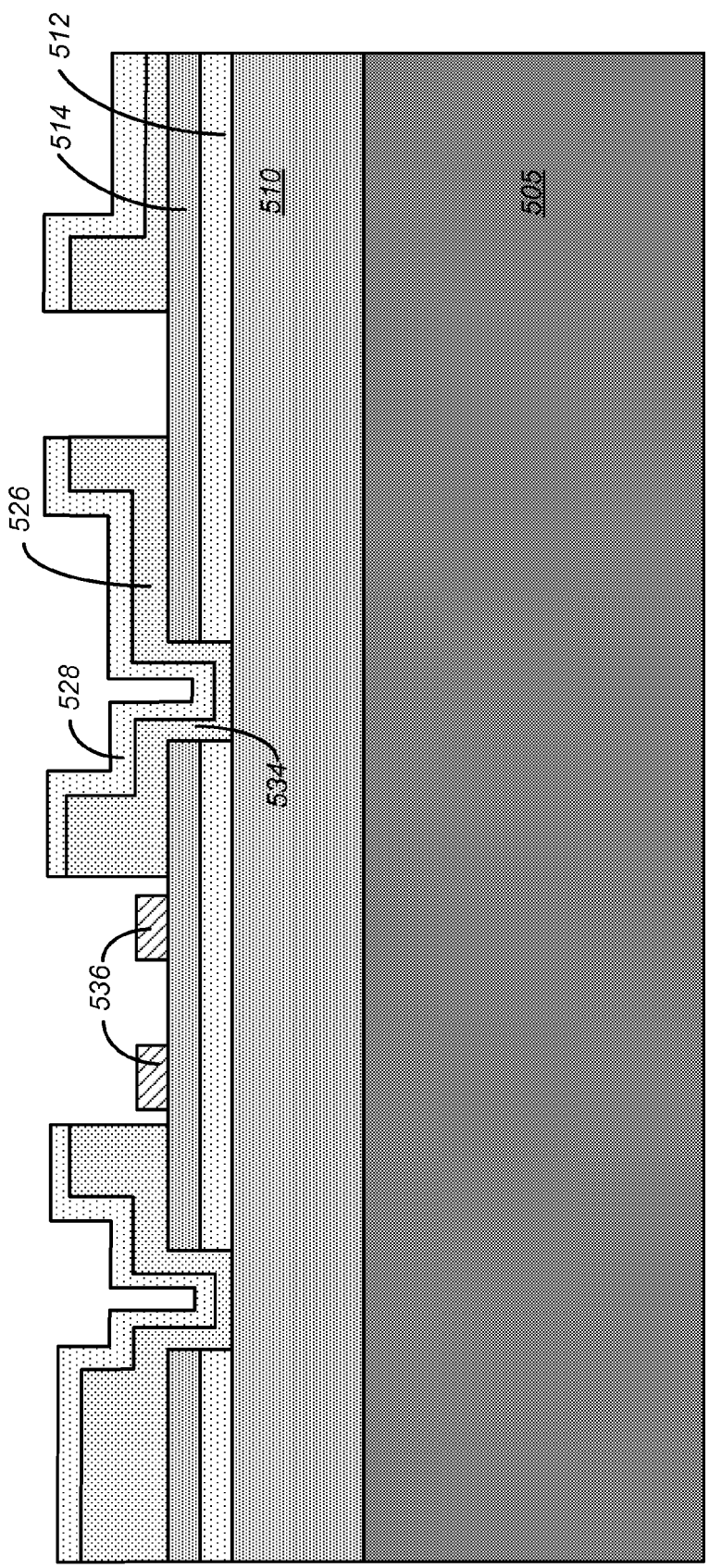

FIG. 5E illustrates formation, for example, by deposition and patterning, of source contacts 536 in electrical contact with the third epitaxial layer 514. Referring to FIG. 3, source contact region 322 is formed as a hexagonal pattern inside source region 320 in some embodiments. Typically, the source contacts 536 are annealed after formation. Although deposition and patterning may be used, other formation processes, including liftoff processes can be utilized according to embodiments of the present invention.

Figure 5F:
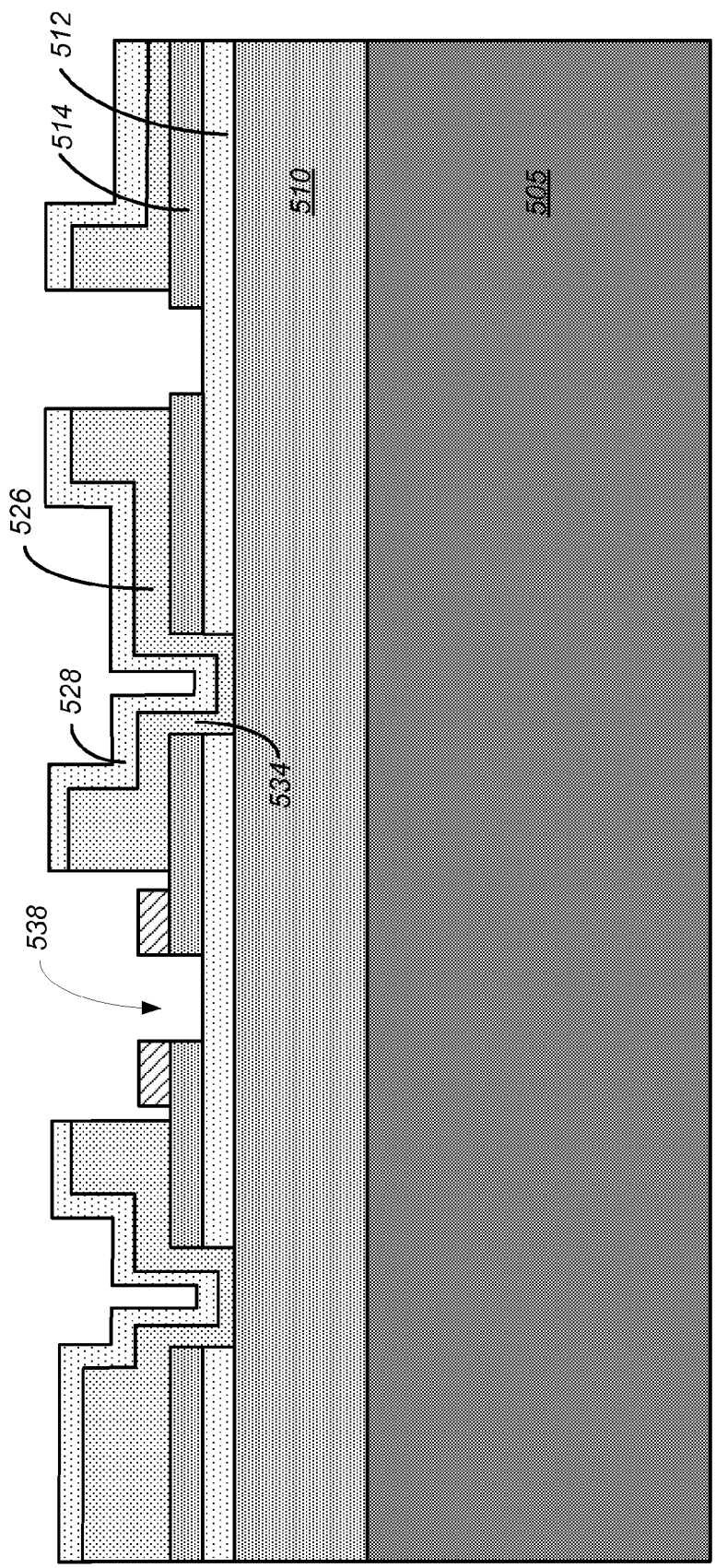

In FIG. 5F, removal of portions of the third epitaxial layer 514 are illustrated during a portion of the process for forming the source via 538, which provides a region later filled by the source metal for the vertical JFET. As illustrated in FIG. 5F, the prior formation of the source contact 536 enables the removal process, such as etching, to be self-aligned as the regions of the third epitaxial layer 514 between the source contacts 536, which serve as a mask, are removed. In plan view in FIG. 3, the material removed can be in the form of a hexagon 324 disposed inside the hexagonal pattern of the source contact region 322 in some embodiments. Although the removal process extends to the top surface or into the second epitaxial layer 512 in this illustration, this is not required by the present invention and the removal process may terminate inside the third epitaxial layer 514. In some embodiments, the removal process exposes a portion of the second epitaxial layer 512 in order to provide electrical connectivity between a source contact and the second epitaxial layer as described more fully below, resulting in the second epitaxial layer having an equal potential as source region. In this way, the source and the drain of vertical JFET can form a p-n junction body diode separated by the first epitaxial layer 510, which is the drift layer.

Figure 5G:
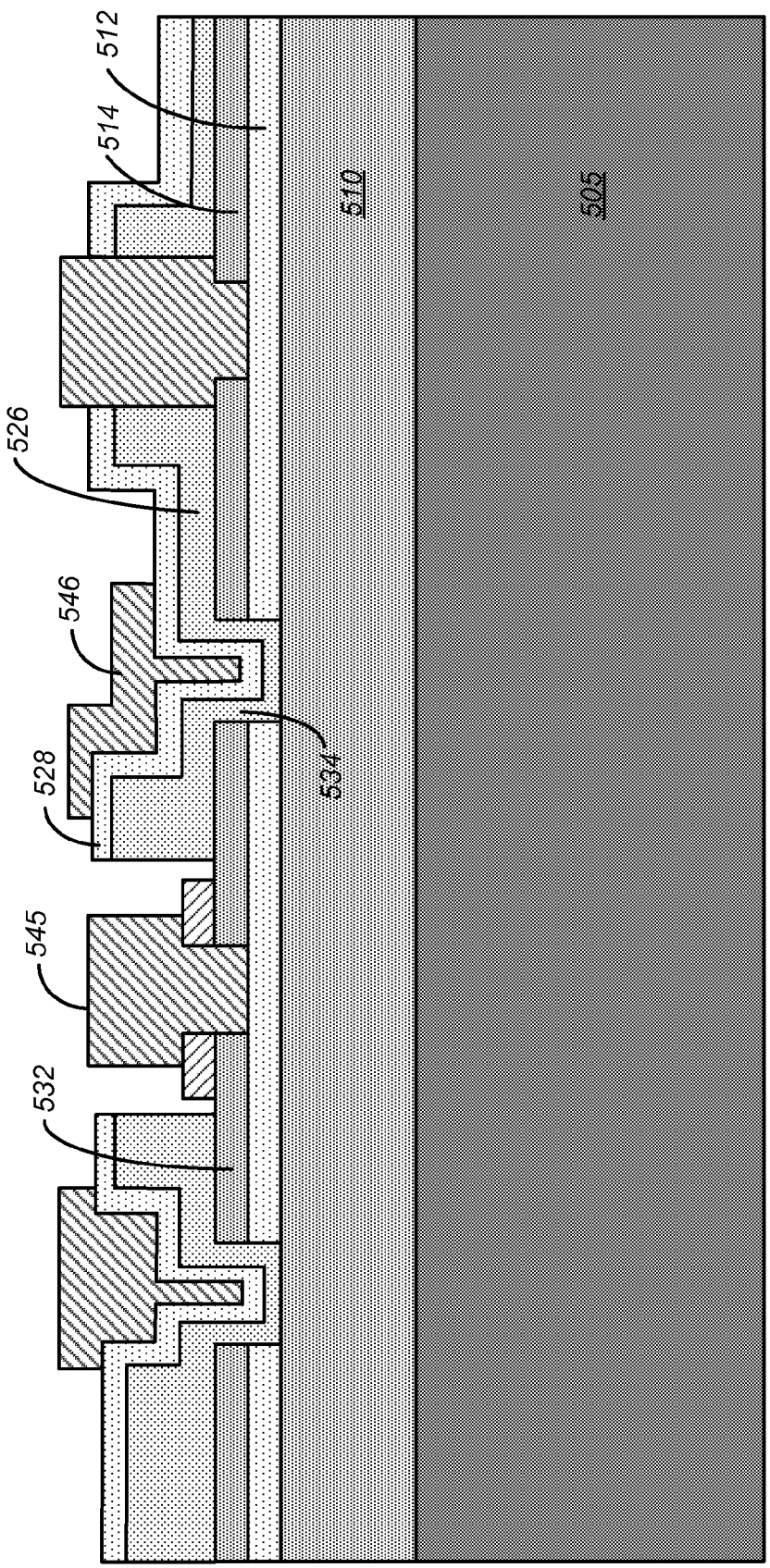
Figure 5H:
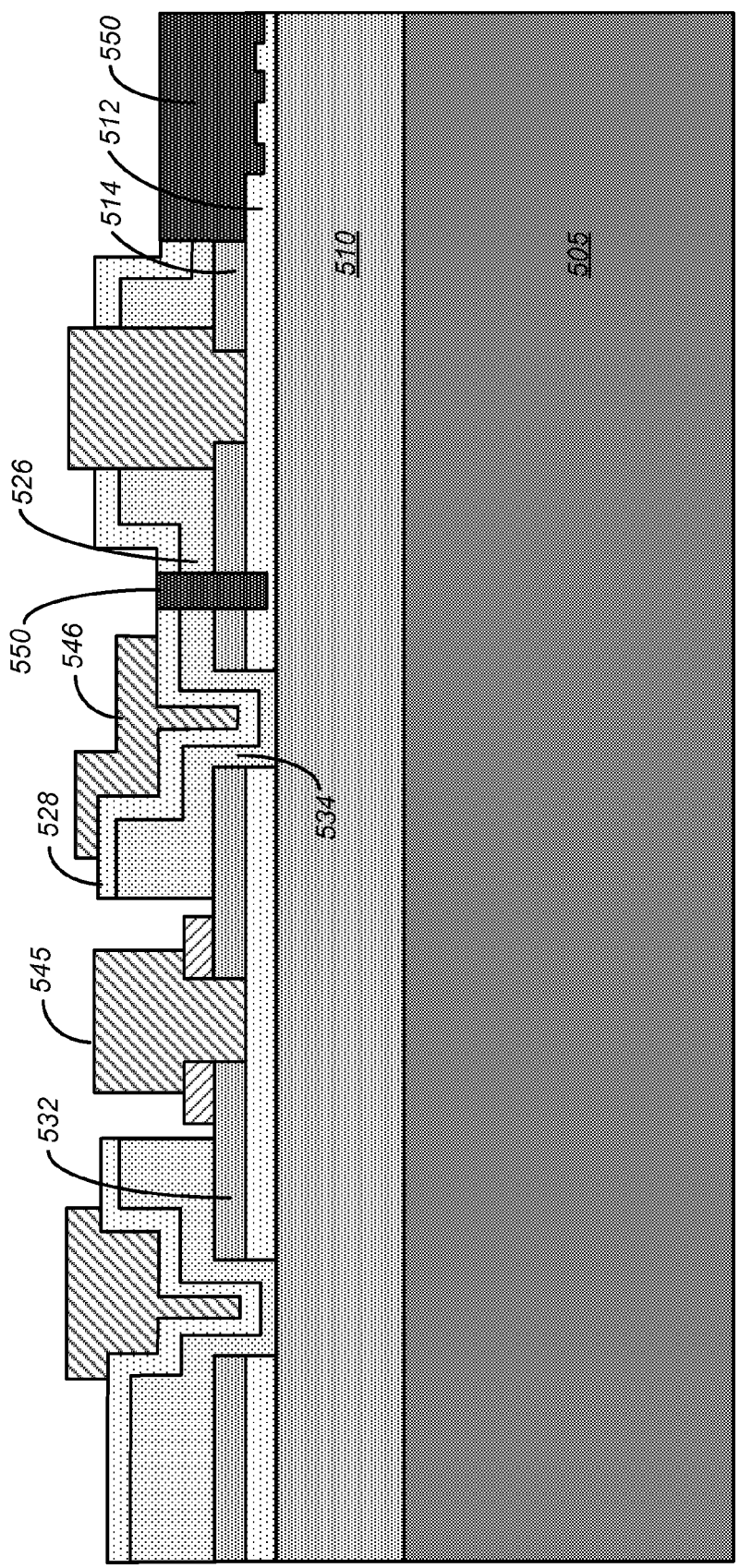

Referring to FIG. 5G, source contacts 545 are formed in electrical connection with the third epitaxial layer (i.e., the lateral source channel regions 532), and, thereby, to the vertical source channel regions 534 and the underlying drift layer. Concurrently, or during different processing steps, gate contacts 546 are formed in electrical connection with the gate regions. In FIG. 5G, the connection to the portion of the gate between adjacent regrowth pedestals is illustrated. As illustrated in FIG. 5L, additional gate contacts to the portions of the gate in the regrowth pedestals are formed at a different cross-section of the device structure. Referring to FIG. 5L, in order to provide for electrical contact to the buried p-type layer forming one of the gate regions, portions of the third epitaxial layer 514 are removed to expose the second epitaxial layer 512. In the illustrated embodiment, current blocking pads 590 are utilized, although this is not required by the present invention. A contact metal 592 is deposited or otherwise formed to make electrical contact to the buried p-type gate material in second epitaxial layer 512. In the illustrated embodiment, an interlayer dielectric (ILD) 594 and a pad metal 596 are utilized to provide connectivity to other gate regions and electrical isolation from the source regions. Depending on the particular embodiment, metallization formed during source metallization steps can be utilized to supplement the gate metals as illustrated. One of ordinary skill in the art would recognize many variations, modifications, and alternatives.

It should be noted that the source contact 545 is shorted to the second epitaxial layer 512 (e.g., the buried gate material), placing the second epitaxial layer at the same potential as the source contact. This geometry prevents the second epitaxial layer 512 potential from drifting during device operation. The source connected back-gate and the drain of vertical JFET form p-n junction body diode separated by the first epitaxial layer, which is the drift layer. Accordingly, the current flow from the source flows through the lateral portion of the source channel and the vertical portion of the source channel.

Structures described herein are compatible with a variety of edge termination techniques. Additional description related to edge termination techniques is described in U.S. patent application Ser. No. 13/334,742, entitled "Method and System for Junction Termination in GaN Materials Using Conductivity Modulation," filed on Dec. 22, 2011, the disclosure of which is hereby incorporated by reference in its entirety for all purposes.

Merely by way of example, an exemplary structure suitable for edge termination is described below. This particular structure is not required by the present invention and other suitable edge termination structures are included within the scope of the present invention. In order to provide for edge termination in one exemplary embodiment, a junction termination process is performed as illustrated in FIG. 5H. The edge termination structures 550 are defined using suitable processing techniques. The structure of the edge termination structures 550 can vary, depending on the particular applications.

Although some embodiments may use an ion implantation process to form edge termination structures 550, this is not required by the present invention. Other techniques for forming edge termination structures, including by etching and epitaxial regrowth, and other suitable techniques, are included within the scope of the invention.

Figure 5I:
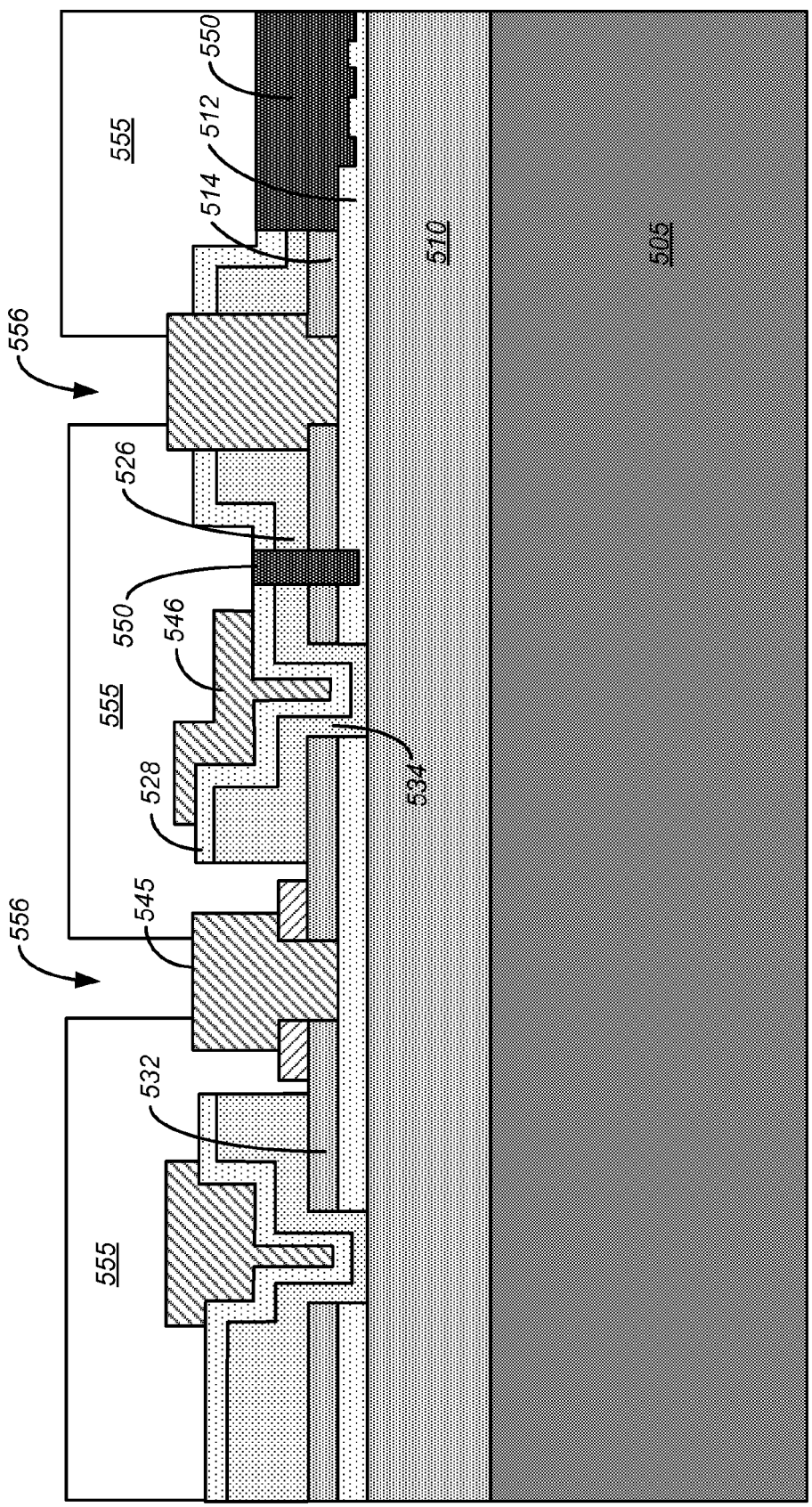

FIG. 5I illustrates deposition of a interlayer dielectric (ILD) 555 and formation of a plurality of vias 556 extending through the ILD 555 to exposed portions of the source contacts 545. The interlayer dielectric layer 555 is illustrated as disposed over the gate regions and the edge termination structures. The vias 556 passing through the ILD 555 enable formation, as described below, of source metallization to provide electrical connection between the source region and external drivers. A variety of suitable materials can be used to fabricate the ILD, including spin-on glass, silicon oxide materials, silicon nitride materials, and the like.

Figure 5J:
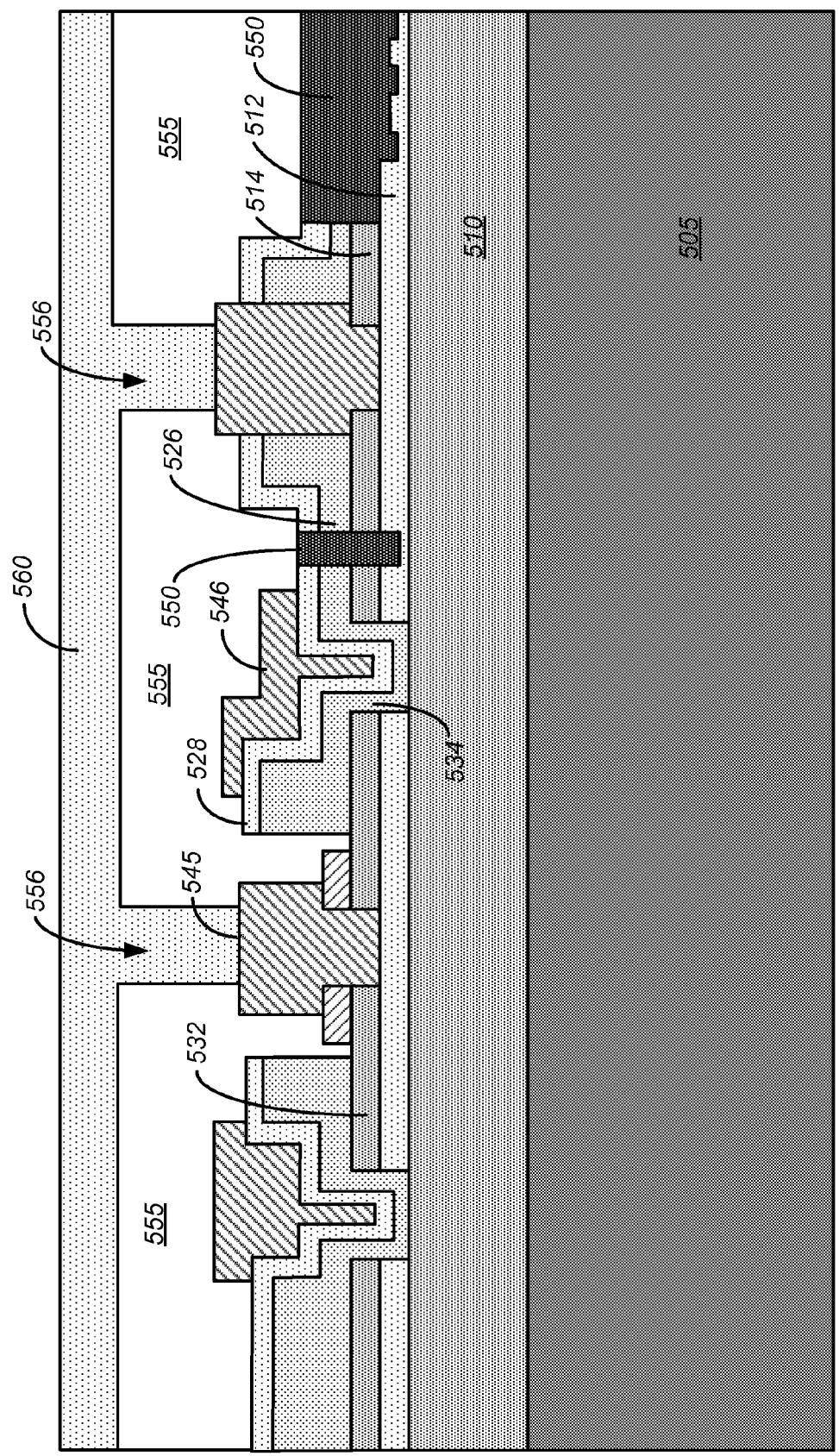
Figure 5K:
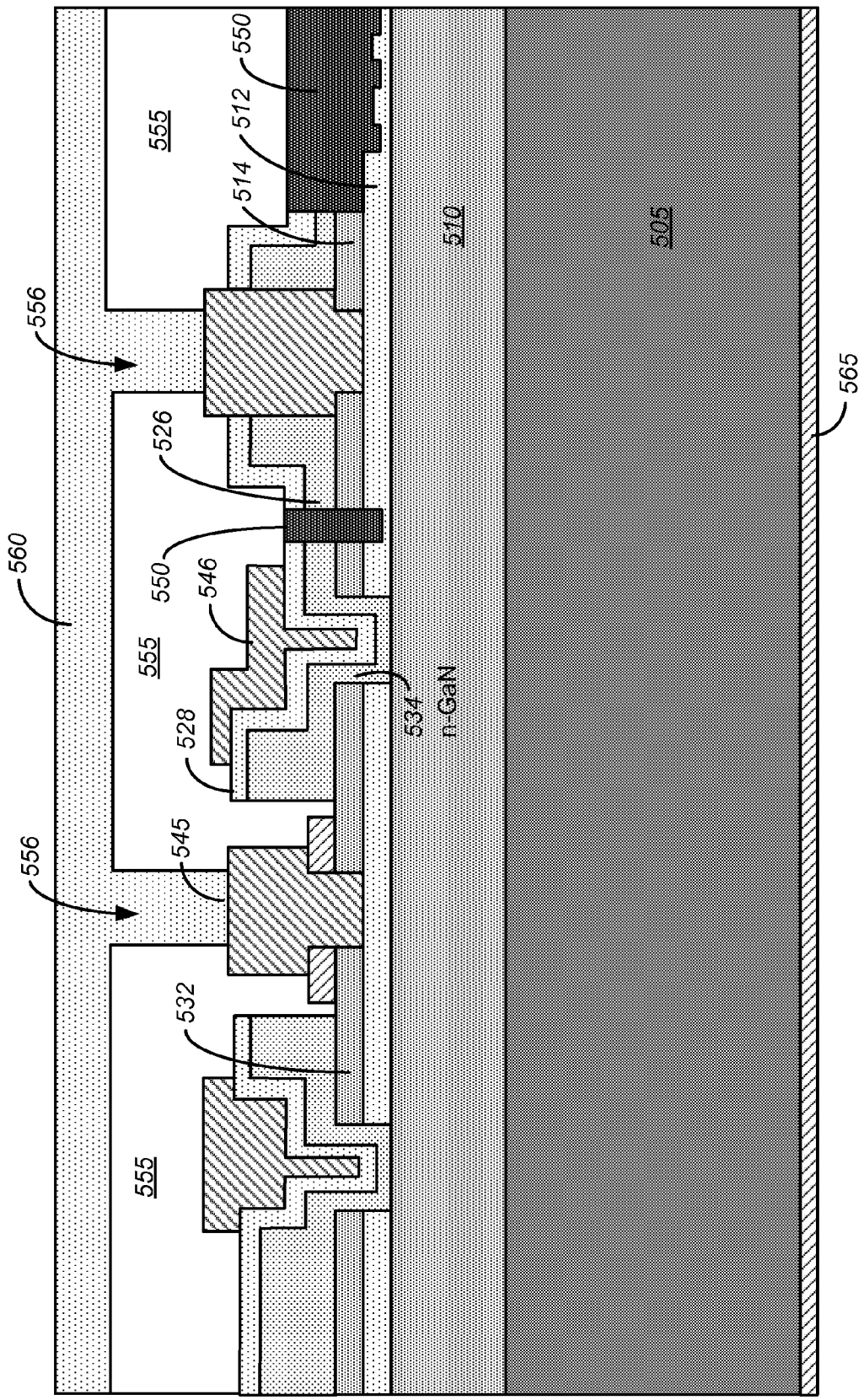
Figure 5L:
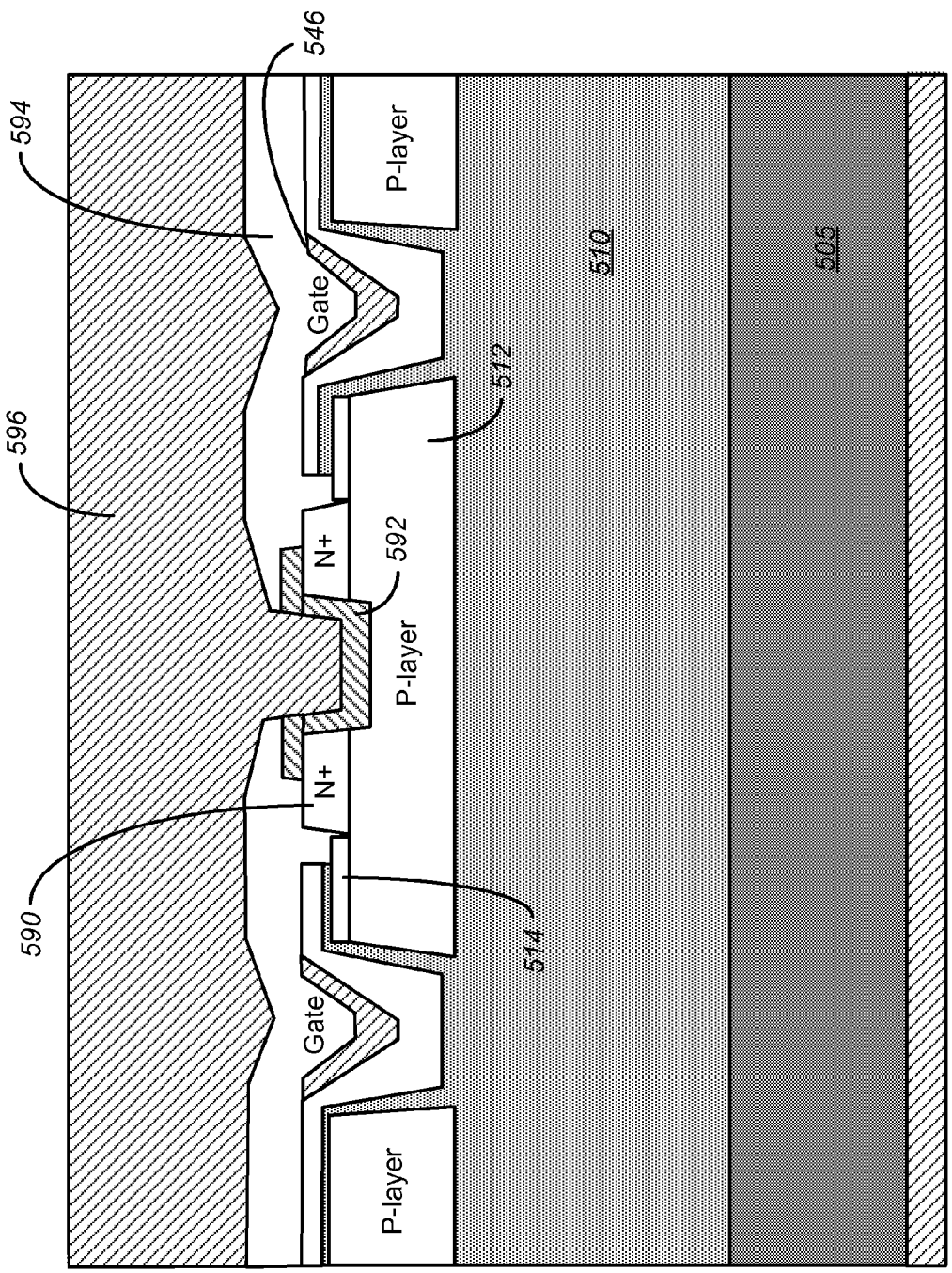

FIG. 5J illustrates formation of source metallization 560 over the ILD 555 and in the vias 556. Referring once again to FIG. 5L, gate metallization will also be formed at a different cross-section of the device structure, providing for electrical connection to gate contacts 546 and to gate contacts 592 shown in FIG. 5L in electrical connection with the gate material (buried p-type layer) in the regrowth pedestals. FIG. 5K illustrates formation of the drain metallization 565 on the surface of the III-nitride substrate. Connections to external systems can be made via electrodes using wire bonding, soldering, sintering, or other techniques.

Figure 6A:
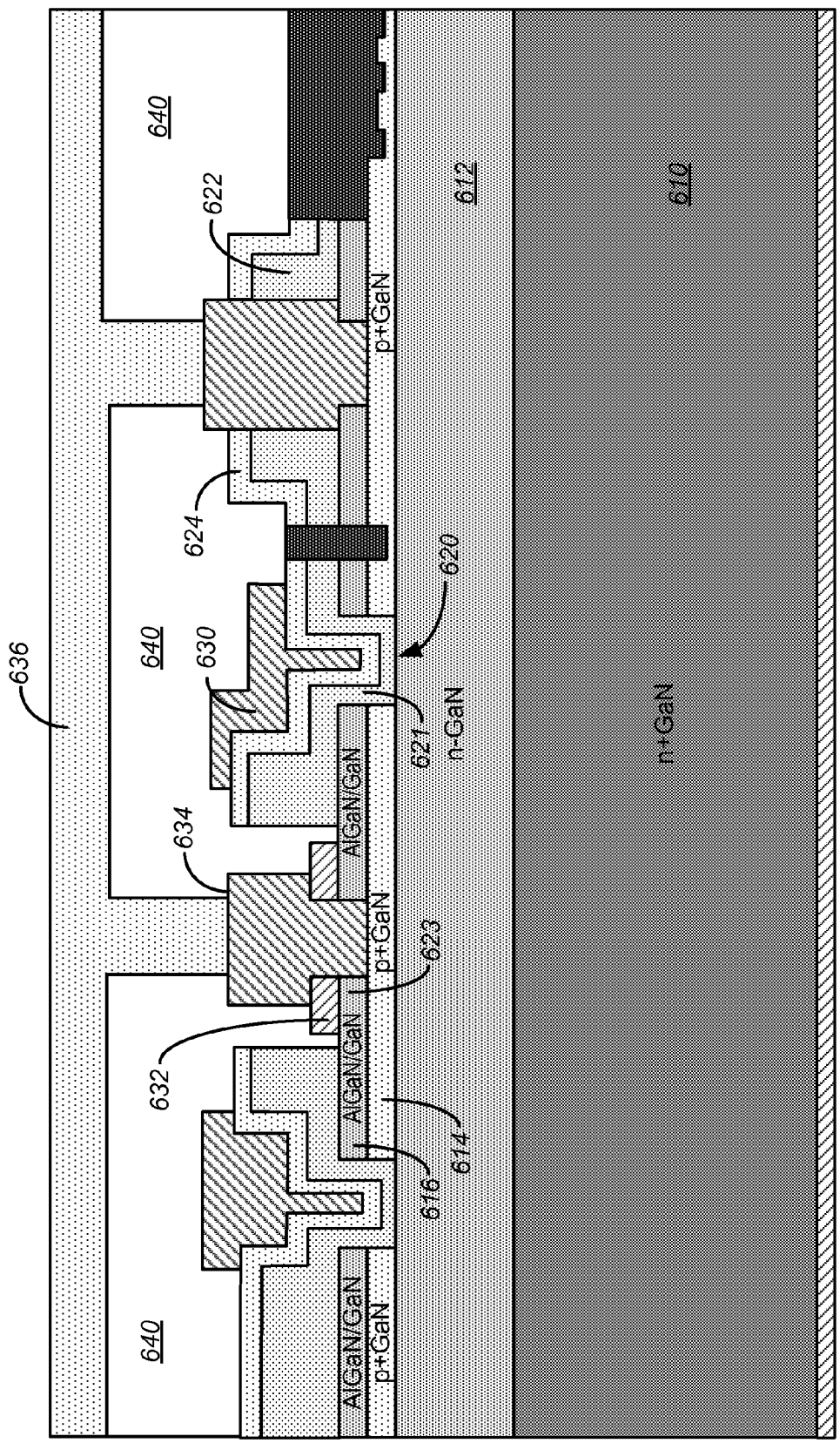
FIG. 6A is a simplified cross-section of a vertical JFET according to an embodiment of the present invention.

FIG. 6A is a simplified cross-section of a vertical JFET according to an embodiment of the present invention. The structure illustrated in FIG. 6A shares similarities with the structure illustrated in FIG. 4 and the description provided in relation to FIG. 4 is applicable to FIG. 6A as appropriate. The vertical JFET includes a III-nitride substrate 610 (e.g., an n-type GaN substrate) that is associated with the drain of an array of JFETs operating in parallel. The vertical JFET also includes one or more epitaxial layers coupled to the III-nitride substrate. As illustrated in FIG. 6A, these epitaxial layers, which may be referred to as as-grown epitaxial layers include an n-drift layer 612 (e.g., n-type GaN), a p-type gate layer 614, and an n-type lateral source channel layer 616. In some embodiments, the lateral source channel layer 616 includes AlGaN material, GaN material, combinations thereof, or the like. Additionally, buffer and interface layers can be utilized as appropriate to the particular application.

Trenches 620 are formed in the p-type gate layer 614 and the lateral source channel layer 616 and regrowth is performed to form a vertical source channel regrown layer 622 and a regrown gate layer 624. The two-part channel thus includes a first part 621 that is adjacent the sidewalls of the trenches 620 (e.g., using regrown GaN-based material) and a second part 623 formed using a portion of the lateral source channel layer 616. The second portion of the two-part channel is illustrated as being formed in the top layer of the regrowth pedestal, which may be arrayed as a plurality of hexagonal cells as described herein.

In some embodiments, the trenches 620 are defined in a hexagonal pattern, forming a plurality of hexagonal regrowth pedestals including portions of the p-type gate layer and the lateral source channel layer. As discussed above, the inventors have determined that when the plurality of hexagonal cells (i.e., regrowth pedestals that are coupled to and/or formed from the one or more epitaxial layers and extending in a direction normal to the III-nitride substrate) have sidewalls that are substantially aligned with respect to crystal planes of the III-nitride substrate, then the quality of the regrown material can be improved in comparison with cells that are misaligned with respect to the crystal planes. As an example, the regrowth pedestals can be aligned so that the m-planes of the III-nitride substrate are the regrowth surfaced (i.e., the sidewalls). In addition to alignment with the m-planes, approximate alignment, for example at an angle between the sidewalls and the m-planes of less than 15°, less than 10°, less than 5°, less than 4°, less than 3°, less than 2°, less than 1°, or the like are included within the scope of the present invention.

Gate contacts, including gate contact 630, are formed in electrical contact with regrown gate layer 624 and p-type gate layer 614 (these gate contacts are not illustrated in the cross-section shown in FIG. 6A), respectively.

In order to provide electrical connection to the lateral source channel layer 616, portions of the regrown epitaxial layers are removed to provide access for source contacts 632 and source metallization 634 and 636. As discussed previously, an ILD 640 can be utilized to provide for electrical separation between various elements of the JFET.

Figure 6B:
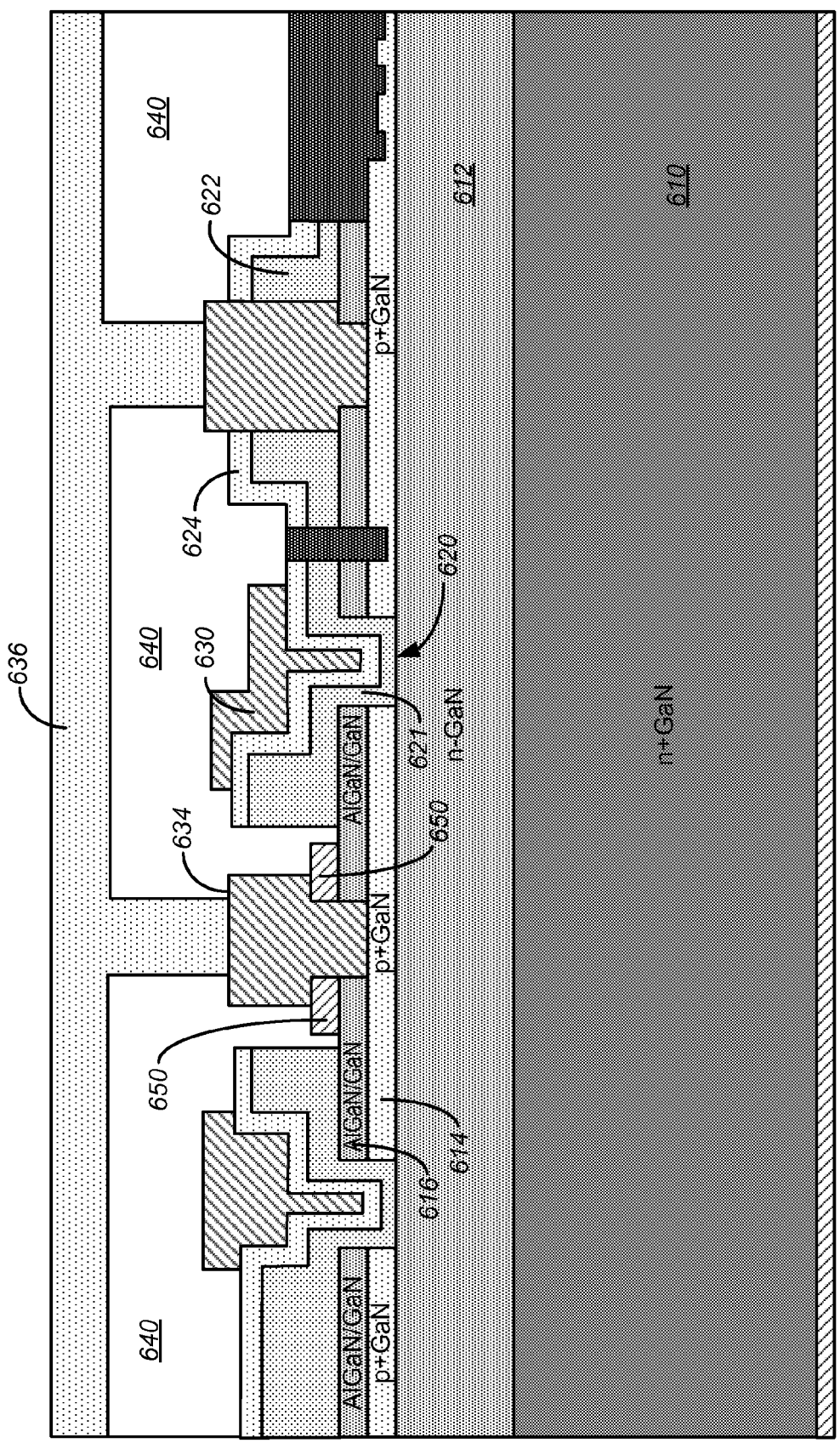
FIG. 6B is a simplified cross-section of a vertical JFET according to an alternative embodiment of the present invention.

FIG. 6B is a simplified cross-section of a vertical JFET according to an alternative embodiment of the present invention. The structure illustrated in FIG. 6B shares similarities with the structure illustrated in FIG. 6A and the description provided in relation to FIG. 6A is applicable to FIG. 6B as appropriate. As illustrated in FIG. 6B, heavily doped n-type structures 650 are formed in association with each source region. The heavily doped n-type structures 650 are electrically coupled to the lateral channel source layer 616 in order to contribute to reductions in series resistance between the source contacts and the lateral channel. The heavily doped n-type structures can be fabricated using a regrowth process, an ion implantation process, or the like.

Figure 7:
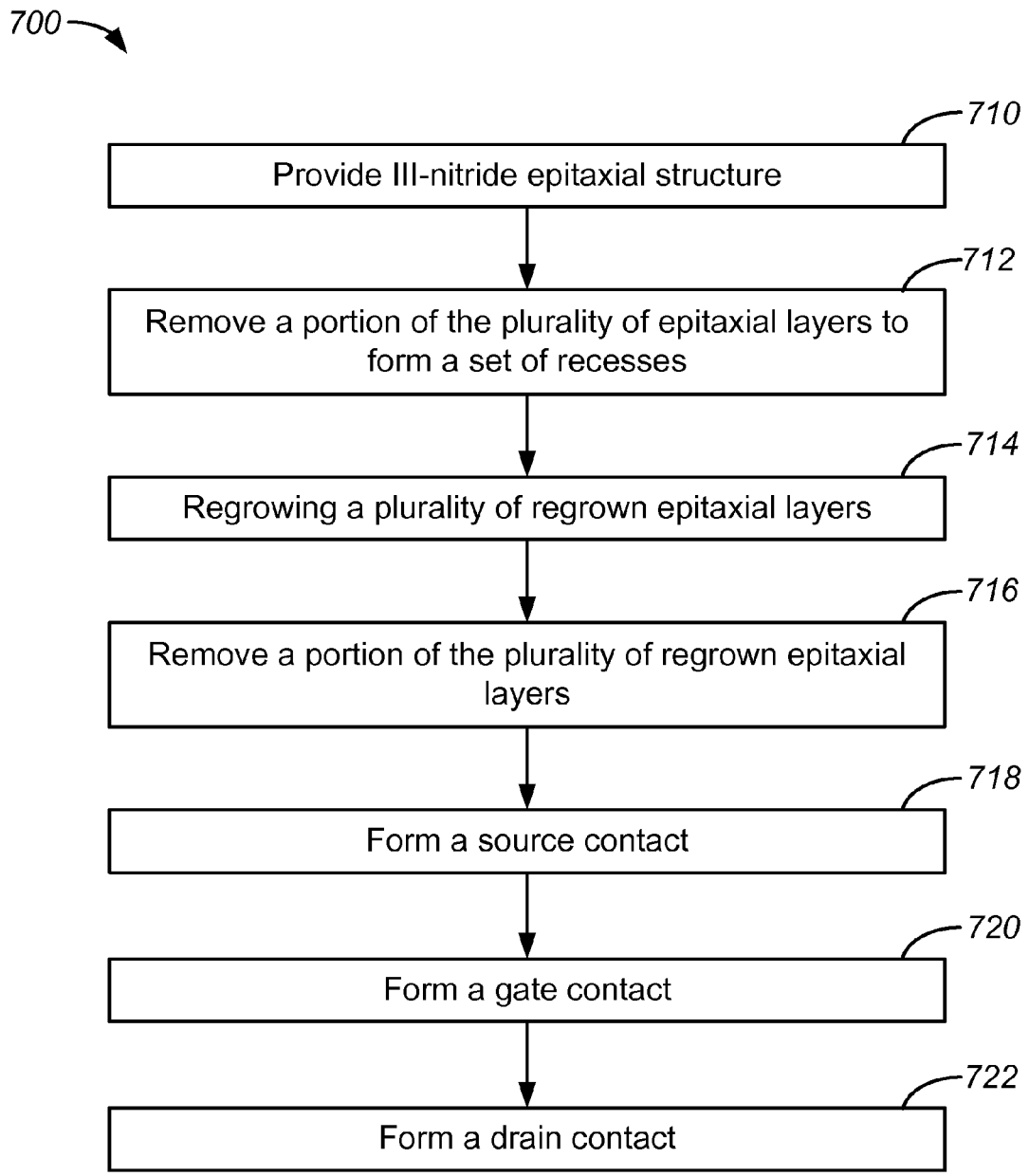
FIG. 7 is a simplified flowchart illustrating a method of fabricating a JFET according to an embodiment of the present invention.

FIG. 7 is a simplified flowchart illustrating a method of fabricating a JFET according to an embodiment of the present invention. The method 700 includes providing a III-nitride epitaxial structure including a III-nitride substrate and a plurality of epitaxial layers coupled to the III-nitride substrate (710). The method also includes removing a portion of the plurality of epitaxial layers to form a set of recesses extending a predetermined distance into the plurality of epitaxial layers. (712) The set of recesses are disposed between remaining portions of the plurality of epitaxial layers. The set of recesses can be patterned as a hexagonal structure to provide a set of hexagonal regrowth pedestals.

The method also includes regrowing a plurality of epitaxial layers coupled to at least a portion of one of the plurality of epitaxial layers and the remaining portions of the plurality of epitaxial layers (714). One of the plurality of regrown epitaxial layers (e.g., the first regrown epitaxial layer) is electrically coupled to one of the plurality of epitaxial layers (e.g., the last of the plurality of epitaxial layers). As an example, regrowing the plurality of regrown epitaxial layers can include regrowing a first epitaxial layer of a first conductivity type (an n-type layer electrically connected to the drift layer) and regrowing a second epitaxial layer of a second conductivity type different from the first conductivity type (a p-type layer suitable for use in forming a gate region). In some embodiments, at least one of the plurality of regrown epitaxial layers is a conformal layer.

In an embodiment, one of the regrown epitaxial layers (e.g., the first regrown layer) forms a first part of a source channel and one of the plurality of epitaxial layers (e.g., the last grown layer) forms a second part of the source channel and another of the plurality of epitaxial layers (e.g., the layer underlying the last grown layer) comprises a gate region of the vertical JFET. In some implementations, the plurality of regrown epitaxial layers are characterized by a thickness equal to the predetermined distance.

The method further includes removing a portion of the plurality of regrown epitaxial layers to expose a portion of the one of the plurality of epitaxial layers (716). Referring to FIG. 6A, the source definition process removes portions of the regrown epitaxial layers 622 and 624 to expose the second regrown epitaxial layer 616.

Additionally, the method includes forming a source contact electrically coupled to the one of the plurality of epitaxial layers (718), forming a gate contact electrically coupled to another of the plurality of epitaxial layers (720), and forming a drain contact electrically coupled to the III-nitride substrate (722).

Figure 8A:
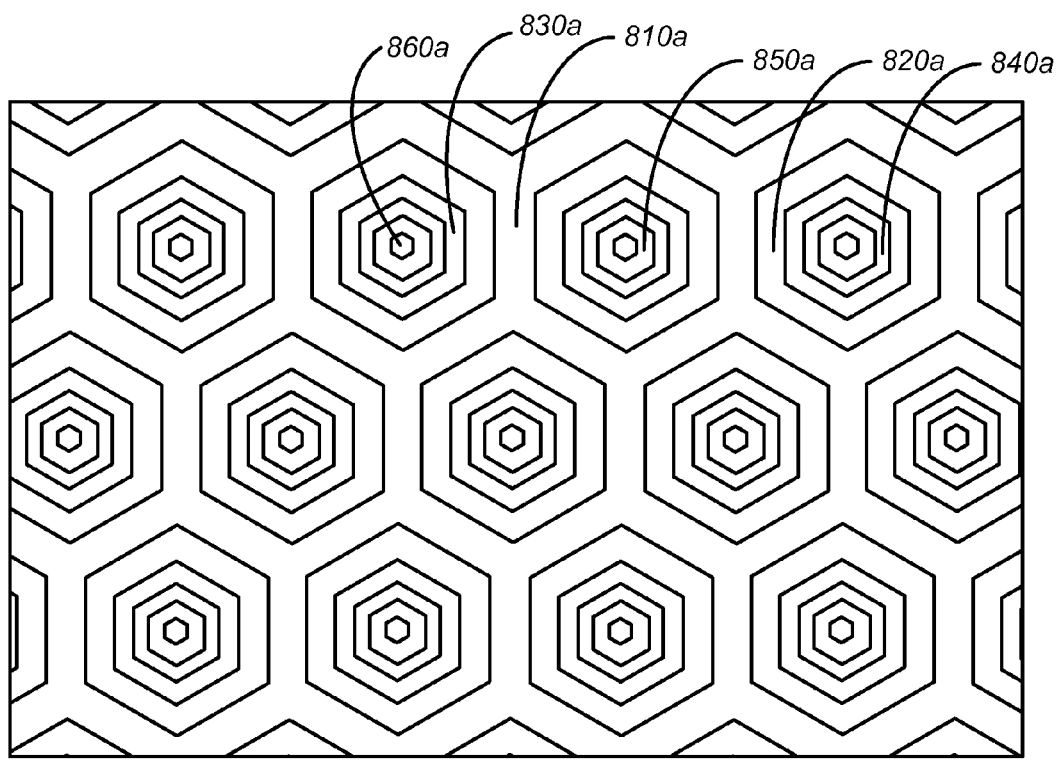
FIG. 8A is a plan view of a hexagonal cell structure for a vertical JFET according to an embodiment of the present invention.
Figure 8B:
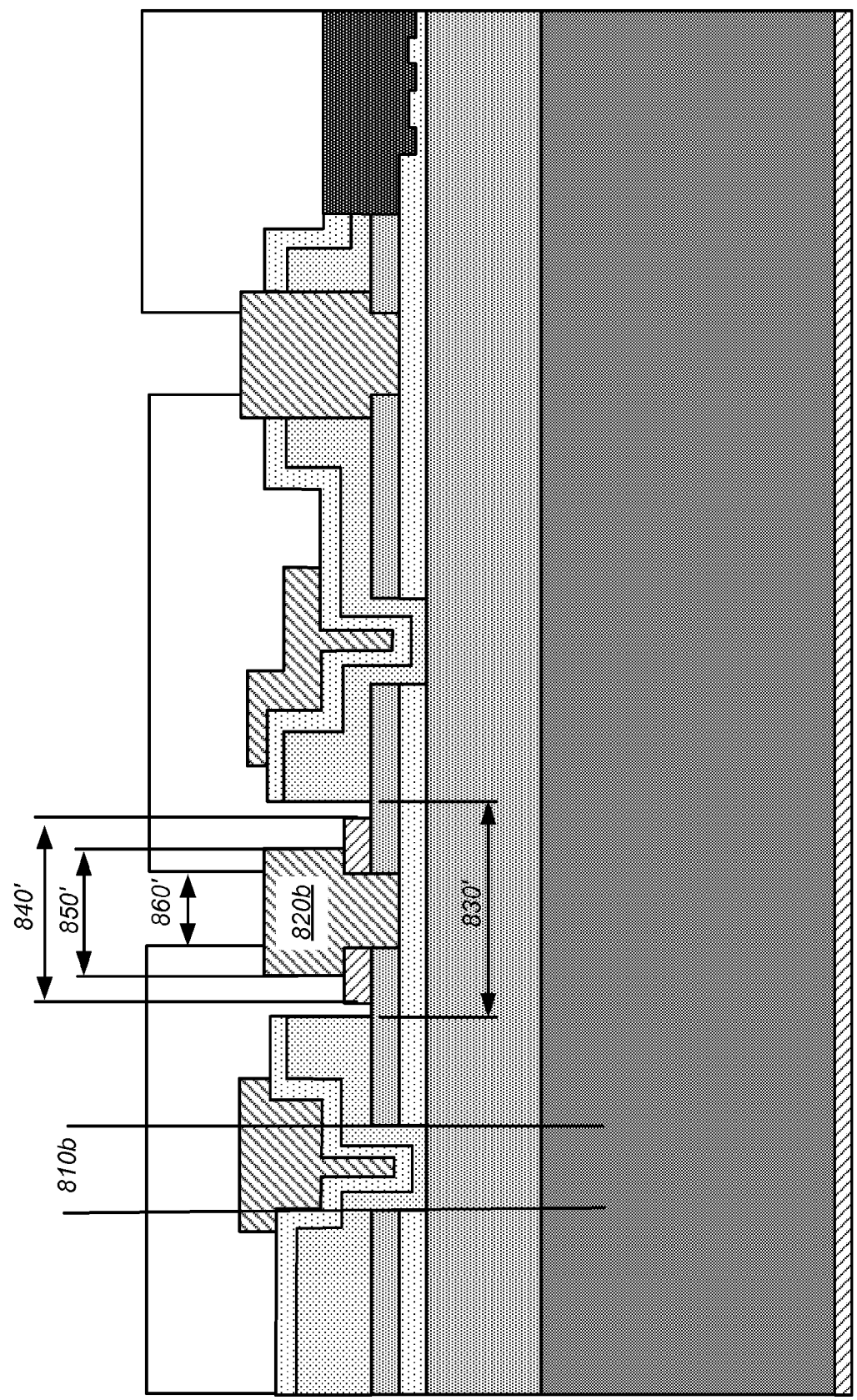
FIG. 8B is a simplified cross-section of the vertical JFET illustrated in FIG. 8A.

FIG. 8A is a plan view of a hexagonal cell structure for a vertical JFET according to an embodiment of the present invention. FIG. 8B is a simplified cross-section of the vertical JFET illustrated in FIG. 8A. Together, these figures illustrate the spatial relationships between the elements of the hexagonal cell structure of the vertical JFET. As discussed above, in some embodiments, the vertical JFETs are arrayed in a hexagonal pattern to provide benefits including high packing density. Referring to both FIGS. 8A and 8B, the gate region 810a is illustrated as a hexagonal cell structure surrounding a set of smaller hexagons or other suitable shapes. In cross-section, gate region 810b appears on either side of the transistor, which is centered on the source contact 820b in some configurations.

The source definition area is associated with a hexagonal cell 830a having a width defined by 830'. Between the outer edges of hexagonal cell 830a and the inner edges of gate region 810a, portions of the lateral source channel are present as illustrated by hexagonal cell 820a in FIG. 8A. In some embodiments, the length of the lateral source channel ranges from about 0.2 µm to about 5 µm, for example, 2 µm. Hexagonal cell 840a defines the source metal area, with a width defined by 840'. In some implementations, a gap exists between the outer edges of the source metal area and the inner edges of the source definition area, but this is not required by embodiments of the present invention.

The source contact is associated with hexagon 850a, with a width equal to 850'. The inner most feature is the p-type plug via, associated with region 860a, with a width of 860'. In some embodiments, the p-type plug via is hexagonal, but it can be other shapes as well, including circular, rectangular, or the like. Patterning of the source metal structures using the p-type via mask enables self-aligned formation of the via as described herein. It will be appreciated that the source contact formation follows the formation of the via as illustrated in FIGS. 5F and 5G.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A vertical JFET comprising:
a GaN substrate comprising a drain of the JFET;
a plurality of patterned epitaxial layers coupled to the GaN substrate, wherein:
 a distal epitaxial layer with respect to the GaN substrate comprises a first part of a source channel, and
 portions of adjacent patterned epitaxial layers are separated by a gap having a predetermined distance;
a plurality of regrown epitaxial layers coupled to the distal epitaxial layer and disposed in at least a portion of the gap, wherein a proximal regrown epitaxial layer with respect to the GaN substrate comprises a second part of the source channel;
a source contact passing through portions of a distal regrown epitaxial layer with respect to the GaN substrate and in electrical contact with the source channel;
a gate contact in electrical contact with a distal regrown epitaxial layer with respect to the GaN substrate; and
a drain contact in electrical contact with the GaN substrate.

2. The vertical JFET of claim 1 further comprising a second gate contact in electrical contact with a proximal epitaxial layer with respect to the GaN substrate.

3. The vertical JFET of claim 1 wherein the plurality of patterned epitaxial layers are arrayed hexagonally.

4. The vertical JFET of claim 3 wherein each of the plurality of patterned epitaxial layers include sidewalls substantially aligned with respect to crystal planes of the GaN substrate.

5. The vertical JFET of claim 4 wherein the crystal planes are m-planes of the GaN substrate.

6. The vertical JFET of claim 4 wherein the proximal regrown epitaxial layer is regrown on the sidewalls.

7. The vertical JFET of claim 1 wherein the first part of the source channel is adjacent the source contact and the second part of the source channel is adjacent the proximal epitaxial layer.

* * * * *